United States Patent
Kaneko et al.

(10) Patent No.: US 10,074,524 B2
(45) Date of Patent: Sep. 11, 2018

(54) PLASMA PROCESSING APPARATUS AND HIGH FREQUENCY GENERATOR

(71) Applicant: TOKYO ELECTRON LIMITED, Tokyo (JP)

(72) Inventors: Kazushi Kaneko, Miyagi (JP); Kazunori Funazaki, Miyagi (JP); Hideo Kato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 870 days.

(21) Appl. No.: 14/386,648

(22) PCT Filed: Mar. 25, 2013

(86) PCT No.: PCT/JP2013/058530
§ 371 (c)(1),
(2) Date: Sep. 19, 2014

(87) PCT Pub. No.: WO2013/146655
PCT Pub. Date: Oct. 3, 2013

(65) Prior Publication Data
US 2015/0047974 A1    Feb. 19, 2015

(30) Foreign Application Priority Data

Mar. 26, 2012  (JP) .................................. 2012-069735

(51) Int. Cl.
*C23C 14/00*    (2006.01)
*H01J 37/34*    (2006.01)
(Continued)

(52) U.S. Cl.
CPC ........ *H01J 37/3405* (2013.01); *C23C 16/511* (2013.01); *H01J 37/32192* (2013.01);
(Continued)

(58) Field of Classification Search
CPC ............ H01J 37/3405; H01J 37/32192; H01J 37/32935; C23C 16/511; H03B 9/10; H03L 1/00; H03L 5/02
See application file for complete search history.

(56) References Cited

U.S. PATENT DOCUMENTS 5,576,629 A * 11/1996 Turner .................. B24B 37/013
                                                    118/708
5,733,820 A * 3/1998 Adachi .................. G01N 21/68
                                                    216/59
(Continued)

FOREIGN PATENT DOCUMENTS

JP          8-306319 A    11/1996
JP      2002-294460 A    10/2002
(Continued)

OTHER PUBLICATIONS

Translation to Kodita (JP 2004-119179) published Apr. 2004.*
(Continued)

*Primary Examiner* — John Joseph Brayton
(74) *Attorney, Agent, or Firm* — Rothwell, Figg, Ernst & Manbeck, P.C.

(57) ABSTRACT

A plasma processing apparatus (11) is provided with: a processing container (12), in which processing is performed using plasma; a plasma generating mechanism (19), which has a high frequency oscillator that oscillates high frequency, includes a high frequency generator that generates high frequency by being disposed outside of the processing container (12), and which generates plasma in the processing container (12) using the high frequency generated by means of the high frequency generator; a determining mechanism, which determines the state of the high frequency oscillator; and a notifying mechanism, which performs notification of determination results obtained from the determining mechanism.

18 Claims, 16 Drawing Sheets

(51) Int. Cl.
  *C23C 16/511* (2006.01)
  *H03B 9/10* (2006.01)
  *H01J 37/32* (2006.01)
  *H03L 1/00* (2006.01)
  *H03L 5/02* (2006.01)
  *H05H 1/46* (2006.01)

(52) U.S. Cl.
  CPC ... *H01J 37/32311* (2013.01); *H01J 37/32935* (2013.01); *H03B 9/10* (2013.01); *H03L 1/00* (2013.01); *H03L 5/02* (2013.01); *H01J 2237/332* (2013.01); *H05H 2001/4682* (2013.01)

(56) References Cited

U.S. PATENT DOCUMENTS

2004/0146667 A1* 7/2004 Hama .................. C23C 16/045
                                                         428/34.1
2007/0262723 A1* 11/2007 Ikenouchi ......... H01J 37/32174
                                                         315/111.21
2009/0026170 A1* 1/2009 Tanaka .............. H01J 37/32706
                                                         216/60

FOREIGN PATENT DOCUMENTS

| JP | 2002299240 A | * | 10/2002 | ........ H01J 37/32192 |
| JP | 2004-119179 A | | 4/2004 | |
| JP | 2004119179 A | * | 4/2004 | |
| JP | 2008-218362 A | | 9/2008 | |
| WO | 2004/068917 A1 | | 8/2004 | |

OTHER PUBLICATIONS

Machine Translation to Omi (JP 2002-299240) published Oct. 2002. (Year: 2002).*
International Search Report dated Jun. 11, 2013 in PCT/JP2013/058530.

* cited by examiner

PLASMA PROCESSING APPARATUS AND HIGH FREQUENCY GENERATOR

CROSS REFERENCE TO RELATED APPLICATION

This application is a 35 U.S.C. 371 National Phase Entry Application from PCT/JP2013/058530, filed Mar. 25, 2013, which claims priority to Japanese Patent Application No. 2012-069735, filed Mar. 26, 2012, the disclosures of which are incorporated herein in their entirety by reference.

TECHNICAL FIELD

The present disclosure relates to a plasma processing apparatus and a high frequency generator, more particularly, to a high frequency generator that generates microwaves and a plasma processing apparatus that generates plasma using the microwaves.

BACKGROUND

A semiconductor element such as, for example, a large scale integrated circuit (LSI) or a metal oxide semiconductor (MOS) transistor, a liquid crystal display (LCD), or an organic electro luminescence (EL) element, is manufactured by performing a processing such as, for example, etching, chemical vapor deposition (CVD), or sputtering on a substrate to be processed ("processed substrate") which is an object to be processed. The processing such as the etching, the CVD, or the sputtering, includes a processing method using plasma as an energy supply source, that is, plasma etching, plasma CVD, or plasma sputtering.

Here, a technology related to a plasma processing apparatus that performs a processing using plasma is disclosed in WO2004/068917 (Patent Document 1). Patent Document 1 discloses that a magnetron is used as a high frequency generating source when generating microwaves. Since the magnetron may be configured relatively inexpensively and further, output a high power, the magnetron is effectively used as the microwave generating source.

PRIOR ART DOCUMENT

Patent Document

Patent Document 1: Publication WO2004/068917

SUMMARY OF INVENTION

Problems to be Solved

In some cases, a device including a mechanically machined product is used as a high frequency generating source. For example, referring to a case where a magnetron is used as disclosed in Patent Document 1, the magnetron includes mechanically machined products such as, for example, a filament, an anode vane constituting an anode side, and a cavity resonating portion. The magnetron manufactured by assembling such mechanically machined produces suffers from variation in state as compared to a so-called initial state just after the assembly of the magnetron as the magnetron is used. For example, an oscillation state may vary due to consumption of a surface-carbonized layer of a thorium tungsten alloy which is a material that forms the filament. When the state variation of the magnetron is serious, it may have an influence on a plasma processing. Thus, it may be required to perform replacement of a so-called consumable product such as, for example, the filament, or replacement of the magnetron itself.

It is desirable that the replacement timing of the consumable product or the magnetron itself is not included in a time period in which a plasma processing is practically performed on a processed substrate. That is, when the replacement timing of, for example, the magnetron, is reached during the plasma processing of the processed substrate, the plasma processing should be interrupted. Then, semiconductors may not be properly manufactured using the processed substrate for which the plasma processing has been interrupted. Accordingly, it is necessary to avoid the situation that the plasma processing is interrupted while being performed on a processed substrate.

Here, in order to avoid the situation of interrupting the plasma processing, for example, the magnetron may be replaced in advance even though the magnetron is still usable. Of course, however, such an approach may cause a waste. That is, it is required to replace the magnetron as timely as possible.

It may be considered to schedule a magnetron replacement timing by monitoring a reflection wave power generated in a matching device provided within a microwave generator in a plasma processing apparatus so as to detect abnormality in the reflection wave such as, for example, generation of an unexpected reflection wave power. In some cases, however, such abnormality in microwave may be caused due to, for example, a change in an antenna member, other than a factor originated from the magnetron. Accordingly, such an approach is not always proper.

Solution

In an aspect of the present disclosure, a plasma processing apparatus processes an object to be processed using plasma. The plasma processing apparatus includes: a processing container within which a plasma processing is performed; a plasma generating mechanism including a high frequency generator which includes a high frequency oscillator disposed outside the processing container to oscillate a high frequency wave, the plasma generating mechanism being configured to generate the plasma within the processing container using the high frequency wave generated by the high frequency generator; a determining mechanism configured to determine a state of the high frequency oscillator; and a notifying mechanism configured to perform notification of a determination result made by the determining mechanism.

With this configuration, since the state of the high frequency oscillator is determined by the determining mechanism and the determination result is notified, the replacement timing of a consumable product or the high frequency oscillator may be scheduled in consideration of the determination result of the high frequency oscillator. Then, it is possible to avoid the situation that the replacement timing is reached during a plasma processing. Accordingly, with this plasma processing apparatus, the plasma processing may be efficiently performed.

The determining mechanism may include a first determining section configured to determine the state of the high frequency oscillator based on a fundamental frequency component and a different frequency component which are oscillated from the high frequency oscillator.

The first determining section may include a spectrum level detecting section configured to detect a spectrum level of the fundamental frequency component and a spectrum level of the different frequency component, and a spectrum level comparing section configured to compare the spectrum level of the fundamental frequency component and the spectrum level of the different frequency component which are detected by the spectrum level detecting section.

The spectrum level comparing section may calculate a difference between a value of the spectrum level of the fundamental frequency component and a value of the spectrum level of the different frequency component which are detected by the spectrum level detecting section, and determine whether the calculated difference is smaller than a predetermined value.

The predetermined value may be set to be 40 dBm.

The high frequency generator may include an isolator configured to transmit a frequency signal unidirectionally from the high frequency oscillator to a matcher positioned at a load side, and a waveguide provided between the high frequency oscillator and the isolator and configured to propagate the high frequency wave to the isolator side. The spectrum level detecting section may be configured to detect the spectrum level of the fundamental frequency component and the spectrum level of the different frequency component using a high frequency wave branched from the waveguide.

The high frequency generator may include an isolator configured to transmit a frequency signal unidirectionally from the high frequency oscillator to a matcher positioned at a load side, and a directional coupler configured to extract a part of a high frequency wave matched by the matcher. The spectrum level detecting section may be configured to detect the spectrum level of the fundamental frequency component and the spectrum level of the different frequency component using the high frequency wave extracted from the directional coupler.

The determining mechanism may include a second determining section configured to determine the state of the high frequency oscillator based on an initial frequency of a fundamental wave which is oscillated from the high frequency oscillator.

The second determining section may include a frequency detecting unit configured to detect the initial frequency of the fundamental wave and a current frequency of the fundamental wave, and a frequency comparing unit configured to compare the initial frequency of the fundamental wave and the current frequency of the fundamental wave which are detected by the frequency detecting unit.

The high frequency generator may include an isolator configured to transmit a frequency signal unidirectionally from the high frequency oscillator to a matcher positioned at a load side, and a waveguide provided between the high frequency oscillator and the isolator and configured to propagate the high frequency wave to the isolator side. The frequency detecting unit may be configured to detect the initial frequency of the fundamental wave and the current frequency of the fundamental wave using the high frequency wave branched from the waveguide.

The high frequency generator may include an isolator configured to transmit a frequency signal unidirectionally from the high frequency oscillator to a matcher positioned at a load side, and a directional coupler provided between the isolator and the load and configured to extract a part of a high frequency wave matched by the matcher. The frequency detecting unit may be configured to detect the initial frequency of the fundamental wave and the current frequency of the fundamental wave using the high frequency wave extracted from the directional coupler.

The high frequency generator may include an isolator configured to transmit a frequency signal unidirectionally from the high frequency oscillator to a matcher positioned at a load side, a waveguide provided between the high frequency oscillator and the isolator and configured to propagate the high frequency wave to the isolator side, and a directional coupler provided between the isolator and the load and configured to extract a part of a high frequency wave matched by the matcher. The frequency detecting unit may be configured to detect the initial frequency of the fundamental wave and the current frequency of the fundamental wave using the high frequency wave extracted from the waveguide.

The determining mechanism may include a third determining section configured to determine the state of the high frequency oscillator based on an efficiency of the high frequency oscillator.

The third determining section may include an efficiency detecting unit configured to detect an initial efficiency of the high frequency oscillator and a current efficiency of the high frequency oscillator, and an efficiency comparing unit configured to the initial efficiency of the high frequency oscillator and the current efficiency of the high frequency oscillator which are detected by the efficiency detecting unit.

The high frequency generator may include a circuit configured to apply an anode voltage to the high frequency oscillator, an isolator configured to transmit a frequency signal unidirectionally from the high frequency oscillator to a matcher positioned at a load side, and a directional coupler provided between the isolator and the load and configured to extract a part of a high frequency wave matched by the matcher. The efficiency detecting unit may detect the initial efficiency of the high frequency oscillator and the current efficiency of the high frequency oscillator, using an input power to the load extracted from the directional coupler, and the anode voltage and the anode current which are detected from the circuit.

The determining mechanism may include a fourth determining section configured to determine the state of the high frequency oscillator based on an accumulated use time of the high frequency oscillator.

The fourth determining section may include an accumulated use time detecting unit configured to detect the accumulated use time of the high frequency oscillator, and an accumulated use time comparing unit configured to compare a value of the accumulated use time of the high frequency use time of the high frequency oscillator detected by the accumulated use time detecting unit and a predetermined value.

In an aspect of the present disclosure, a high frequency generator includes: a high frequency oscillator configured to oscillate a high frequency wave; a determining unit configured to determine a state of the high frequency oscillator; and a notifying unit configured to perform notification of a determination result made by the determining unit.

With this high frequency generator, a lifespan of the high frequency oscillator or a replacement timing of a consumable produce may be easily scheduled.

The determining unit may include at least one of: a first determining section configured to determine the state of the high frequency oscillator based on a fundamental frequency component and a different frequency component which are oscillated from the high frequency high frequency oscillator; a second determining section configured to determine the state of the high frequency oscillator based on a frequency of a fundamental wave oscillated from the high frequency oscillator; a third determining section configured to determine the state of the high frequency oscillator based on an efficiency of the high frequency oscillator; and a fourth determining section configured to determine the state of the high frequency oscillator based on a accumulated use time of the high frequency oscillator.

Effect of Invention

With the above-described plasma processing apparatus, because the state of the high frequency oscillator is determined by the determining mechanism and the determination result is notified, the replacement timing of a consumable product or the high frequency oscillator may be scheduled in consideration of the determination result of the high frequency oscillator. Then, it is possible to avoid the situation that the replacement timing is reached during a plasma processing. Accordingly, with this plasma processing apparatus, the plasma processing may be efficiently performed.

In addition, the above-described high frequency generator, a lifespan of the high frequency oscillator or a replacement timing of a consumable produce may be easily scheduled.

DETAILED DESCRIPTION TO EXECUTE INVENTION

Figure 1:
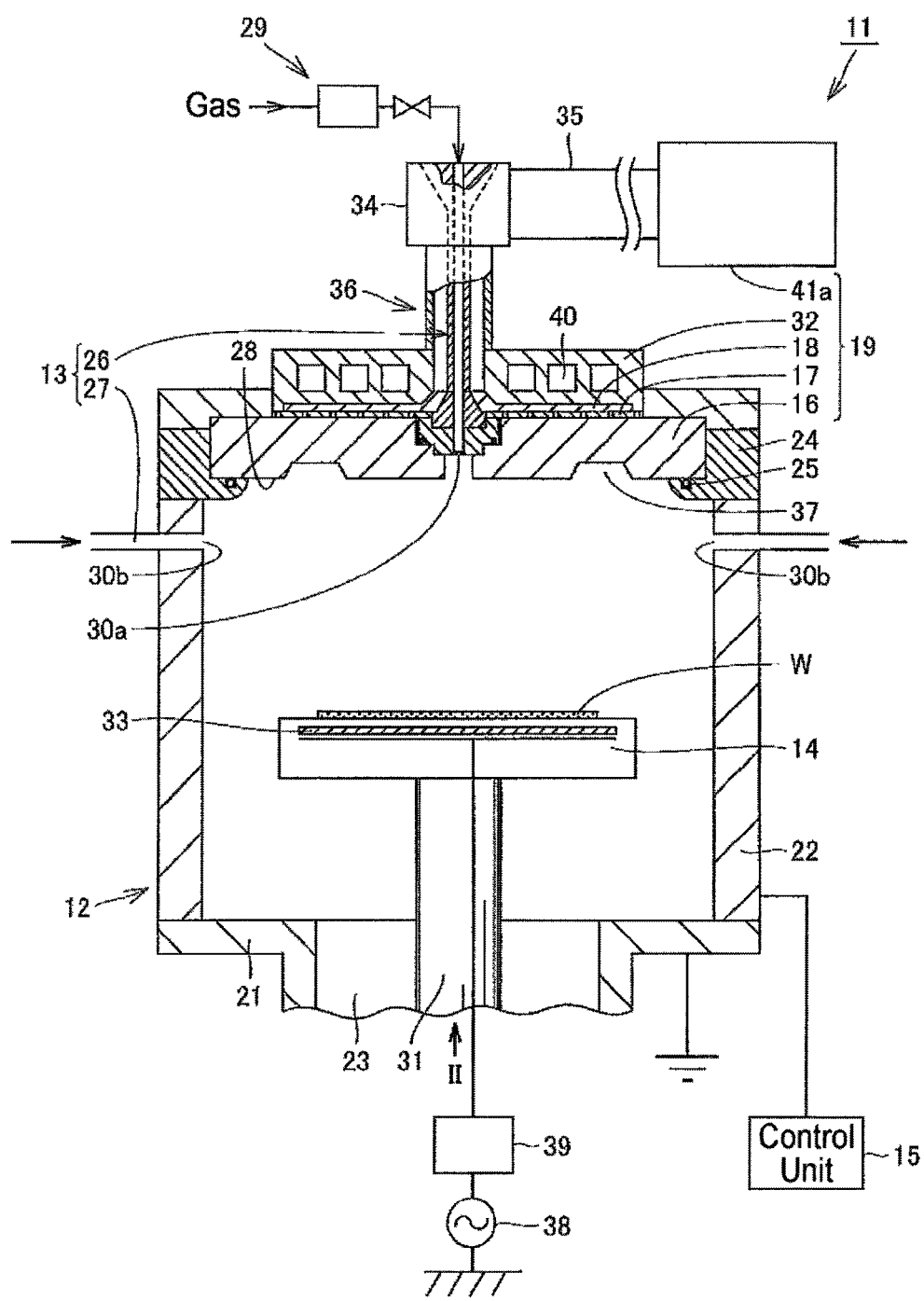
FIG. 1 is a schematic cross-sectional view illustrating a main portion of a plasma processing apparatus according to an exemplary embodiment of the present disclosure.
Figure 2:
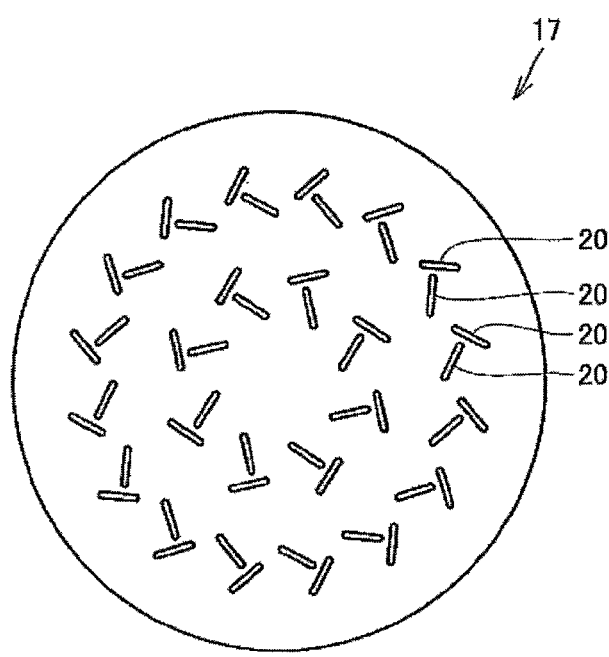
FIG. 2 is a schematic view illustrating a slot antenna plate included in the plasma processing apparatus illustrated in FIG. 1, which is viewed in a direction indicated by the arrow II in FIG. 1.

Hereinafter, exemplary embodiments of the present disclosure will be described with reference to the accompanying drawings. FIG. 1 is a schematic cross-sectional view illustrating a main portion of a plasma processing apparatus according to an exemplary embodiment of the present disclosure. FIG. 2 is a view illustrating a slot antenna plate included in the plasma processing apparatus illustrated in FIG. 1, which is viewed from the bottom side, that is, in a direction indicated by the arrow II in FIG. 1. In addition, in FIG. 1, the hatching of some members is omitted for easy understanding. Further, in the exemplary embodiment, the direction indicated by the arrow II in FIG. 1 or a vertical direction of a ground in FIG. 1 illustrated in an opposite direction to the direction indicated by the arrow II is referred to as a vertical direction in the plasma processing apparatus.

Referring to FIGS. 1 and 2, the plasma processing apparatus 11 processes a substrate W to be processed (hereinafter, referred to as a "processed substrate W") which is an object to be processed, using plasma. Specifically, a processing such as, for example, etching, CVD, or sputtering is performed. As the processed substrate W, a silicon substrate used for manufacturing a semiconductor device may be exemplified.

The plasma processing apparatus 11 includes a processing container 12 within which the processed substrate W is processed by plasma, a gas supply unit 13 configured to supply a gas for plasma excitation or a gas for a plasma processing into the processing container 12, a disc-shaped holding table 14 provided in the processing container 12 to hold the processed substrate W, a plasma generating mechanism 19 configured to generate the plasma in the processing container 12 using microwaves, and a control unit 15 configured to control an operation of the entire plasma processing apparatus 11. The control unit 15 performs a control of the entire plasma processing apparatus 11 such as, for example, a gas flow in the gas supply unit 13, and a pressure in the processing container 12.

The processing container 12 includes a bottom portion 21 positioned below the holding table 14 and a side wall 22 extending upward from the outer periphery of the bottom portion 21. The side wall 22 has a substantially cylindrical shape. An exhaust hole 23 for use in gas exhaust is provided in the bottom portion 21 of the processing container 12 to penetrate a portion of the bottom portion 21. The top side of the processing container 12 is opened and the processing container 12 is configured to be sealed by a cover portion 24 disposed on the top side of the processing container 12, a dielectric window 16 to be described below, and an O ring 25 as a sealing member interposed between the dielectric window 16 and the cover portion 24.

The gas supply unit 13 includes a first gas supply unit 26 configured to supply a gas toward the center of the processed substrate W through a first flow path and a second gas supply unit 27 configured to supply a gas from the outside of the processed substrate W through a second flow path. A gas supply hole 30a configured to supply the gas in the first gas supply unit 26 through the first flow path is provided at the center of the dielectric window 16 in a radial direction and at a position which retreats to an inner side of the dielectric window 16 from a bottom surface 28 of the dielectric window 16 which becomes an opposite surface facing the holding table 14. The first gas supply unit 26 supplies the inert gas for plasma excitation or the gas for plasma processing while adjusting a flow rate by a gas supply system 29 connected to the first gas supply unit 26. The second gas supply unit 27 is formed by placing a plurality of gas supply holes 30b configured to supply the inert gas for the plasma excitation or the gas of the plasma processing to the inside of the processing container 12 in a portion of an upper side of the side wall 22. The plurality of gas supply holes 30b is provided at regular intervals in a circumferential direction. The same kind of the inert gas for the plasma excitation or the gas for the plasma processing is supplied to the first gas supply unit 26 and the second gas supply unit 27 from the same gas supply source. Meanwhile, according to a request or a control content, different gases may be supplied from the first gas supply unit 26 and the second gas supply unit 27, and the flow rate ratio of the gases may be adjusted.

In the holding table 14, a radio frequency (RF) bias high frequency power supply 38 is electrically connected to an electrode in the holding table 14 through a matching unit 39. The high frequency power supply 38 may output high frequency waves of, for example, 13.56 MHz, with a predetermined power (bias power). The matching unit 39 accommodates a matcher that takes a matching between an impedance of the high frequency power supply 38 and an impedance of a load side in which the load is mainly the electrode, the plasma, or the processing container 12, and a blocking condenser configured to generate a magnetic bias is included within the matcher. Further, during the plasma processing, the bias voltage may be or may not be supplied to the holding table 14.

The holding table 14 may hold the processed substrate W thereon by an electrostatic chuck (not illustrated). Further, the holding table 14 includes, for example, a heater (not illustrated) for heating, and may be set to a desired temperature by a temperature adjustment mechanism 33 provided in the holding table 14. The holding table 14 is supported on an insulative tubular support 31 that extends vertically upward from a lower side of the bottom portion 21. The exhaust hole 23 is provided at the center of the bottom portion 21 of the processing container 12, and the tubular support 31 extends through the exhaust hole 23. An exhaust device (not illustrated) is connected to a lower side of the circular exhaust hole 23 through an exhaust pipe (not illustrated). The exhaust device has a vacuum pump such as, for example, a turbo molecular pump. The inside of the processing container 12 may be decompressed to a predetermined pressure by the exhaust device.

The plasma generating mechanism 19 is provided outside the processing container 12 and includes a microwave generator 41a configured to generate microwaves for the plasma excitation. Further, the plasma generating mechanism 19 includes a dielectric window 16 that is disposed in the upper portion of the container 12 to face the holding table 14 and introduces the microwaves generated by the microwave generator 41a into the processing container 12. Further, the plasma generating mechanism 19 includes the slot antenna plate 17 disposed above the dielectric window 16 to radiate the microwaves to the dielectric window 16 in which the slot antenna plate 17 is provided with a plurality of slot holes. In addition, the plasma generating mechanism 19 includes a dielectric member 18 which is disposed above the slot antenna plate 17 so as to propagate the microwaves introduced by a coaxial waveguide 36 in a radial direction, thereby delaying the microwaves.

The microwave generator 41a is connected to an upper portion of the coaxial waveguide 36 configured to introduce the microwaves, through a mode converter 34 and a rectangular waveguide 35. For example, TE-mode microwaves generated by the microwave generator 41a are converted to TEM-mode microwaves by the mode converter 34 after passing through the rectangular waveguide 35 and propagated to the coaxial waveguide 36. A detailed configuration of the microwave generator 41a will be described below. The rectangular waveguide 35 side in the microwave generator 41 becomes a load side to be described below.

The dielectric window 16 is substantially disc-shaped and made of a dielectric material. A circular concave portion 37 recessed in a tapered shape is provided on a portion of the bottom surface 28 of the dielectric window 16 so as to easily generate standing waves by the introduced microwaves. With the aid of the concave portion 37, plasma may be efficiently generated by the microwaves at the bottom side of the dielectric window 16. Further, quartz or alumina may be exemplified as a specific material for the dielectric window 16.

The slot antenna plate 17 has a thin disc shape. As illustrated in FIG. 2, the plurality of slot holes 20 is provided in such that each two slot holes 20 form a pair in which the two slot holes 20 are orthogonal to each other at a predetermined interval, and slot pairs formed by the slot holes 20 are provided at predetermined intervals in the circumferential direction. Further, the plurality of slot pairs formed by the slot holes 20 is also provided at predetermined intervals in the radial direction.

The microwaves generated by the microwave generator 41a are propagated to the dielectric member 18 through the coaxial waveguide 36. The microwaves are spread radially toward the outside in the radial direction in the dielectric member 18 sandwiched between a cooling jacket 32 and the slot antenna plate 17 to be radiated to the dielectric window 16 from the plurality of slot holes 20 provided on the slot antenna plate 17. The cooling jacket 32 includes a circulation path 40 therein so as to circulate coolant, and cools, for example, the slot antenna 17, the dielectric window 16, and the dielectric member 18 so as to adjust the temperature thereof. After penetrating the dielectric window 16, the microwaves generate an electric field just below the dielectric window 16 so as to generate plasma in the processing container 12.

When microwave plasma is generated in the plasma processing apparatus 11, a so-called plasma generation region having a relatively high electron temperature of plasma (electron temperature $Te \geq 1.5$ eV) is formed in a region positioned just below the bottom surface 28 of the dielectric window 16, specifically, below the bottom surface 28 of the dielectric window 16 by several centimeters. In addition, a so-called plasma diffusion region is formed in a region positioned below the plasma generation region so as to diffuse the plasma generated in the plasma generation region. The plasma diffusion region is a region in which the electron temperature of the plasma is relatively low (electron temperature Te<1.5 eV) and the plasma processing is performed. Then, since so-called plasma damage is not imparted to the processed substrate W during the plasma processing and further, the electron density of the plasma is high (electron density Ne>$1.5 \times 10^{12}$/cm$^3$), the plasma processing may be performed efficiently.

The plasma generating mechanism 19 is configured to include the dielectric window 16 configured to transmit high frequency waves generated by the magnetron as a high frequency oscillator to be described below into the processing container 12 therethrough, and the slot antenna plate 17 formed with the plurality of slot holes 20 and configured to radiate the high frequency waves to the dielectric window 16. In addition, the plasma generated by the plasma generating mechanism 19 is adapted to be generated by a radial line slot antenna.

Here, descriptions will be made on a detailed configuration of the microwave generator 41a included in the plasma generating mechanism 19 provided in the plasma processing apparatus 11 configured as described above.

Figure 3:
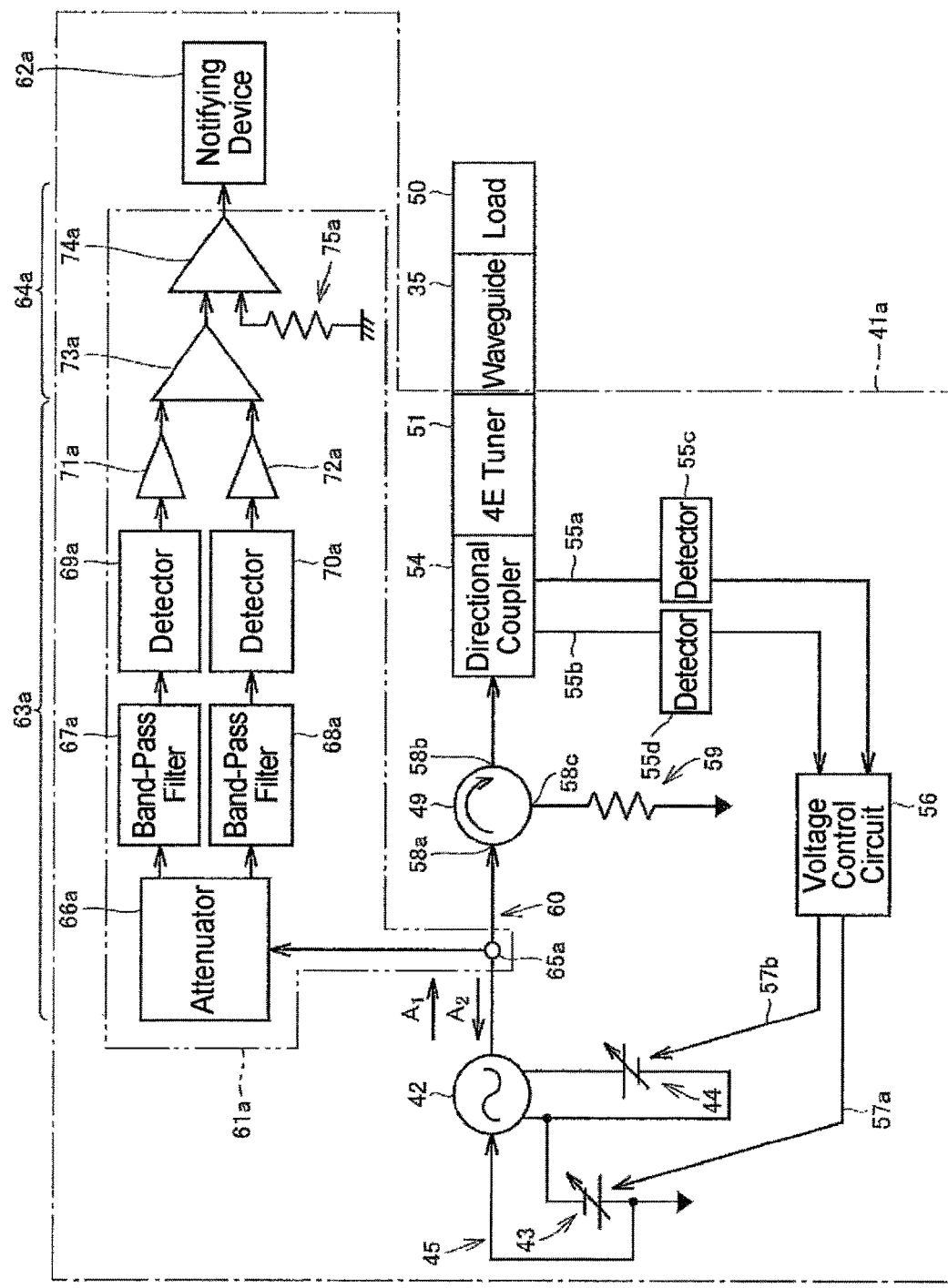
FIG. 3 is a block diagram illustrating a schematic configuration of a microwave generator included in the plasma processing apparatus illustrated in FIG. 1.
Figure 4:
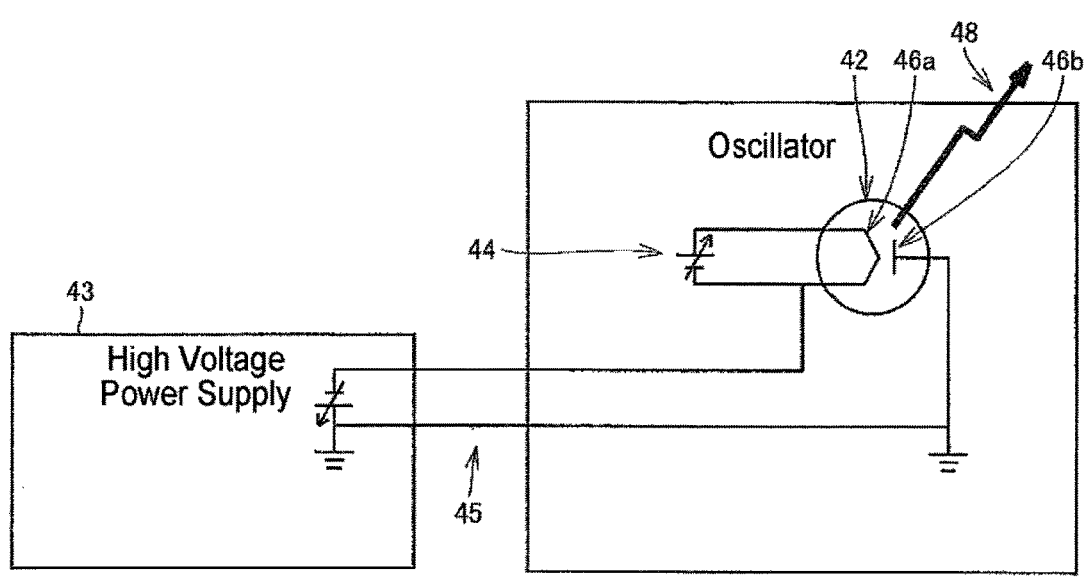
FIG. 4 is a schematic view illustrating a peripheral configuration of a magnetron included in the microwave generator.
Figure 5:
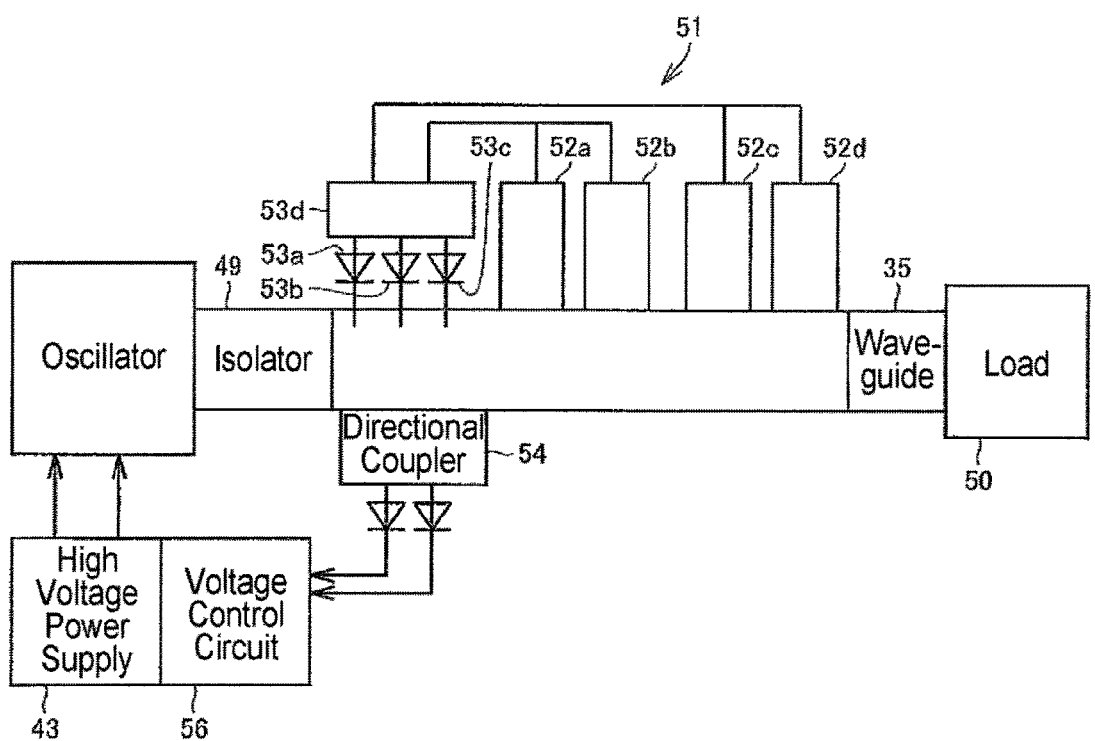
FIG. 5 is a schematic view illustrating a peripheral configuration of a 4E tuner included in the microwave generator.

FIG. 3 is a block diagram illustrating a schematic configuration of the microwave generator 41a. FIG. 4 is a schematic view illustrating a peripheral configuration of a magnetron which is included in the microwave generator 41a and will be described below. FIG. 5 is a schematic view illustrating a peripheral configuration of a 4E tuner as a matching device, which is included in the microwave generator 41a and will be described below.

Referring to FIGS. 1 to 5, the microwave generator 41a includes a magnetron 42 serving as a high frequency oscillator configured to oscillate microwaves as high frequency waves, a high voltage power supply 43 configured to supply a voltage to the magnetron 42, and a filament power supply 44 configured to supply a power to a filament that constitutes a cathode electrode 46a at the time of oscillating the high frequency waves. An oscillation unit is constituted by the magnetron 42 and a launcher (not illustrated) configured to transfer a microwave power of the magnetron 42 to a waveguide. The microwaves oscillated by the magnetron 42 travel in the direction indicated by the arrow $A_1$ in FIG. 3. Further, reflection waves of the microwaves travel in a direction indicated by the arrow $A_2$ which is opposite to the direction indicated by the arrow $A_1$ in FIG. 3.

A circuit 45 is formed between the magnetron 42 and the high voltage power supply 43. An anode current is supplied to the magnetron 42 side from the high voltage power supply 43 side through the circuit 45. The filament is incorporated in the circuit 45, inside the magnetron 42 (see, e.g., FIG. 4). Microwaves 48 output to the outside are generated by the cathode electrode 46a constituted by the filament and an anode electrode 46b formed by receiving the anode current from the high voltage power supply 43. Further, the filament that becomes the cathode side that constitutes the cathode electrode 46a and an anode vane (not illustrated) that forms the anode electrode 46b that becomes the anode side are mechanically machined products manufactured through a mechanical machining.

Further, the microwave generator 41a includes a directional coupler 54 configured to connect the microwaves oscillated by the magnetron 42 through an isolator 49, and a 4E tuner 51 serving as the matcher. The isolator 49 unidirectionally transmits a frequency signal from the magnetron 42 to the 4E tuner 51 positioned at the load 50 side. The load 50 described herein is a member which is positioned at a downstream side of a so-called rectangular waveguide 35, such as, for example, the mode converter 34.

The 4E tuner 51 includes movable short-circuit units 52a, 52b, 52c, and 52d including four movable short-circuit plates (not illustrated) provided at predetermined intervals toward a traveling direction of the microwaves and three probes 53a, 53b, and 53c positioned at the magnetron 42 side with respect to the movable short-circuit unit 52a. The three probes 53a, 53b, and 53c are separated from each other by a distance of ⅛ of a fundamental frequency λ, that is, λ/8 toward the traveling direction of the microwaves. Further, projection amounts of tuning rods (not illustrated) which respectively correspond to the three probes 53a, 53b, and 53c are calculated by an arithmetic operation circuit 53d connected to the three probes 53a, 53b, and 53c.

In addition, the 4E tuner 51 is provided with the directional coupler 54 at the magnetron 42 side with respect to the movable short-circuit unit 52a. The directional coupler 54 is a bidirectional coupler. Meanwhile, the directional coupler 54 may not face the three probes 53a, 53b, and 53c. A power signal of traveling waves that travel in the waveguide is sent to a voltage control circuit 56 provided in the microwave generator 41a by a circuit 55a, using the bidirectional coupler 54. Meanwhile, the power signal of the traveling waves sent by the circuit 55a is detected as a transferring wave power in the detector 55c. In addition, a power signal of the reflection waves that travel in the waveguide is sent to the voltage control circuit 56 provided in the microwave generator 41a by a circuit 55b, using the directional coupler 54. Further, the power signal of the reflection waves sent by the circuit 55b is detected as a reflection wave power in a detector 55d. A control signal of a voltage supplied by the high voltage power supply 43 and a control signal of a voltage supplied to the filament power supply 44 are sent from the voltage control circuit 56 using a control circuit 57a and a control circuit 57b so as to control the voltage of the high voltage power supply 43. That is, the voltage control circuit 56 supplies a current so that a proper voltage that satisfies the specification of the magnetron 42 is applied with respect to the high voltage power supply 43 and the filament power supply 44 such that a set power becomes equal to the traveling wave power detected from the directional coupler 54.

Meanwhile, the isolator 49 provided between the magnetron 42 and the 4E tuner 51 is configured by setting one terminal in a circulator which is a passive element, as a dummy load 59. That is, the isolator 49 is configured by connecting a first terminal 58a positioned at the magnetron 42 side with the oscillation unit, connecting a second terminal 58b positioned at the 4E tuner 51 side with the 4E tuner 51, and connecting the dummy load 59 to a remaining third terminal 58c. With this arrangement, the isolator 49 may unidirectionally transmit the frequency signal from the magnetron 42 to the 4E tuner 51 positioned at the load 50 side.

Here, the microwave generator 41a includes a determining mechanism configured to determine a state of the magnetron 42, and a notifying mechanism configured to perform notification of a determination result made by the determining mechanism. A first determining unit 61a to be described later as the determining mechanism is illustrated by two-dot chain lines in FIG. 3. A notifying device 62a serving as the notifying mechanism performs notification using a sound such as, for example, an alarm or a voice, or notification using, for example, light or vibration.

Next, the determining mechanism will be described in detail. The determining mechanism includes a first determining section 61a configured to determine a state of the magnetron 42 based on a fundamental frequency component and a different frequency component which are oscillated from the magnetron 42 serving as a high frequency oscillator. The first determining section 61a determines the state of the magnetron 42 based on the fundamental frequency component and the different frequency component oscillated from the magnetron 42.

Here, the different frequency component will be briefly described. Among other frequency characteristics of high frequency waves oscillated by a high frequency oscillator, there is a different frequency component so-called spurious which is unintended in design. Such a different frequency component is included in a high frequency wave. Different frequency components tend to increase as the high frequency oscillator is used. The increase of the different frequency components generates reflection waves in a waveguide and a matcher through which the high frequency waves oscillated by the high frequency oscillator are propagated. When the reflection waves are generated, the effective power of the magnetron 42 or a load impedance is also changed. Thus, generating the reflection waves is undesirable. That is, the time when the reflection waves start to occur becomes a reference for a so-called replacement timing of the magnetron 42.

Here, the first determining section 61a includes a spectrum level detecting section 63a configured to detect a spectrum level of a fundamental frequency component and a spectrum level of a different frequency component 63a, and a spectrum level comparing section 64a configured to compare a value of the spectrum level of the fundamental frequency component and a value of the spectrum level of the different frequency component which are detected by the spectrum level detecting section 63a.

The spectrum level detecting section 63a includes a branch portion 65a provided on the way of the waveguide 60, an attenuator 66a configured to attenuate a frequency signal branched and input from the branch portion 65a, a first band-pass filter 67a configured to receive an input of a frequency signal from the attenuator 66a, a second band-pass filter 68a configured to receive an input of a frequency signal from the attenuator 66a, a first detector 69a configured to detect a frequency that has passed through the first band-pass filter 67a, a second detector 70a configured to detect a frequency that has passed through the second band-pass filter 68a, a first gain adjusting amplifier 71a configured to amplify the frequency signal detected by the first detector 69a, and a second gain adjusting amplifier 72a configured to amplify the frequency signal detected by the second detector 70a. Meanwhile, as for the attenuator 66a in this case, a directional coupler may be used. In addition, the spectrum level comparing section 64a includes a subtraction circuit 73a configured to calculate a difference between the frequency amplified by the first gain adjusting amplifier 71a and the frequency amplified by the second gain adjusting amplifier 72a, a comparator 74a configured to compare the difference value calculated by the subtraction circuit 73a and a threshold which is set as a predetermined value, and a threshold adjusting unit 75a configured to adjust the threshold which becomes a target to be compared by the comparator 74a.

The first band-pass filter 67a performs filtering that allows only a frequency band of the fundamental frequency component to pass therethrough and removes the other frequency bands. The first detector 69a detects a fundamental frequency component that has passed through the first band-pass filter 67a. In addition, the fundamental frequency component detected by the first detector 69a is amplified by the first gain adjusting amplifier 71a and input to the subtraction circuit 73a. The second band-pass filter 68a performs filtering that allows only a frequency band of a different frequency component to pass therethrough and removes the other frequency bands. The second detector 70a detects a different frequency component that has passed through the second band-pass filter 68a. In addition, the different frequency component detected by the second detector 70a is amplified by the second gain adjusting amplifier 72a and input to the subtraction circuit 73a. The subtraction circuit 73a calculates a difference between the spectrum level of the fundamental frequency component and the different frequency component which have been individually amplified. Then, the calculated difference is input to the comparator 74a. Further, the target to be compared of the difference which has been adjusted from the threshold adjusting unit 75a is also input to the comparator 74a. The difference value and the threshold are compared by the comparator 74a and the state of the magnetron 42 is determined based on the comparison result. The determination result is input to the notifying device 62a to be notified.

Figure 6:
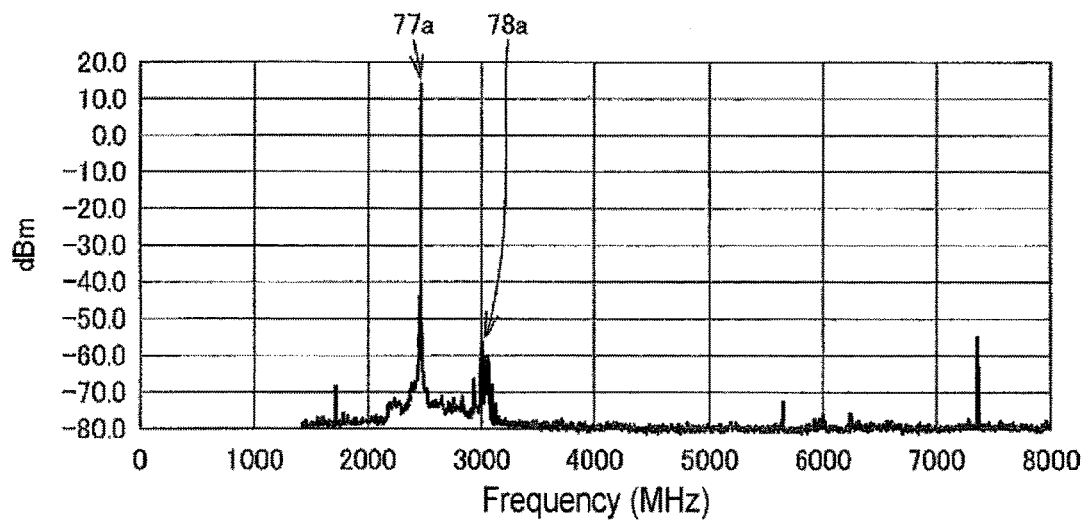
FIG. 6 is a graph representing a frequency in an initial use stage of a magnetron.
Figure 7:
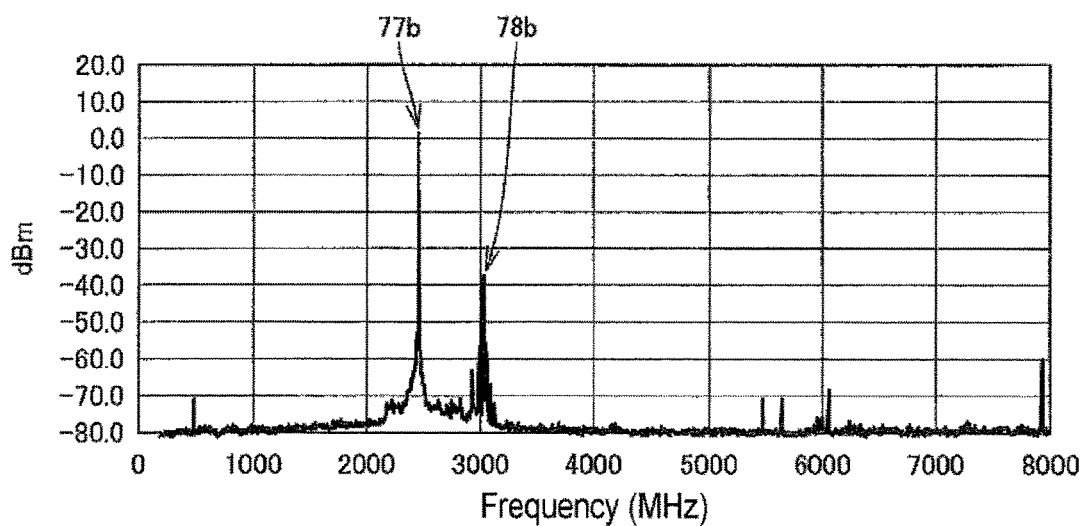
FIG. 7 is a graph representing a frequency after long-term use of the magnetron.

Here, a determination result will be described. FIG. 6 is a graph illustrating a frequency in an initial use stage of the magnetron 42. FIG. 7 is a graph illustrating a frequency after long-term use of the magnetron 42. In FIGS. 6 and 7, the horizontal axes represent frequency (MHz), and vertical axes represent strength (dBm). Referring to FIGS. 6 and 7, the high spectrum 77a near 2450 MHz (2.45 GHz) indicates a fundamental frequency component, and a spectrum 78a near 3000 MHz (3 GHz) indicates a different frequency component.

First, referring to FIG. 6, in the initial use stage of the magnetron 42, the difference between the level of the spectrum 77a of the fundamental frequency component and the level of the spectrum 78a of the different frequency component is relatively large. In FIG. 6, the level of the spectrum 77a of the fundamental frequency component is approximately 0.0 dBm, and the level of the spectrum 78a of the different frequency component is approximately −60.0 dBm in which the difference between the level of the spectrum 77a of the fundamental frequency component and the level of the spectrum 78a of the different frequency component is approximately 60.0 dBm. Referring to FIG. 7, however, after the long-term use, the difference between the level of the spectrum 77a of the fundamental frequency component and the level of the spectrum 78a of the different frequency component 78a is reduced. In FIG. 7, the level of the spectrum 77b of the fundamental frequency component is approximately 0.0 dBm, and the level of the spectrum 78a of the different frequency component is approximately −40.0 dBm in which the difference between the level of the spectrum 77a of the fundamental frequency component and the level of the spectrum 78a of the different frequency component is approximately 40.0 dBm.

Figure 8:
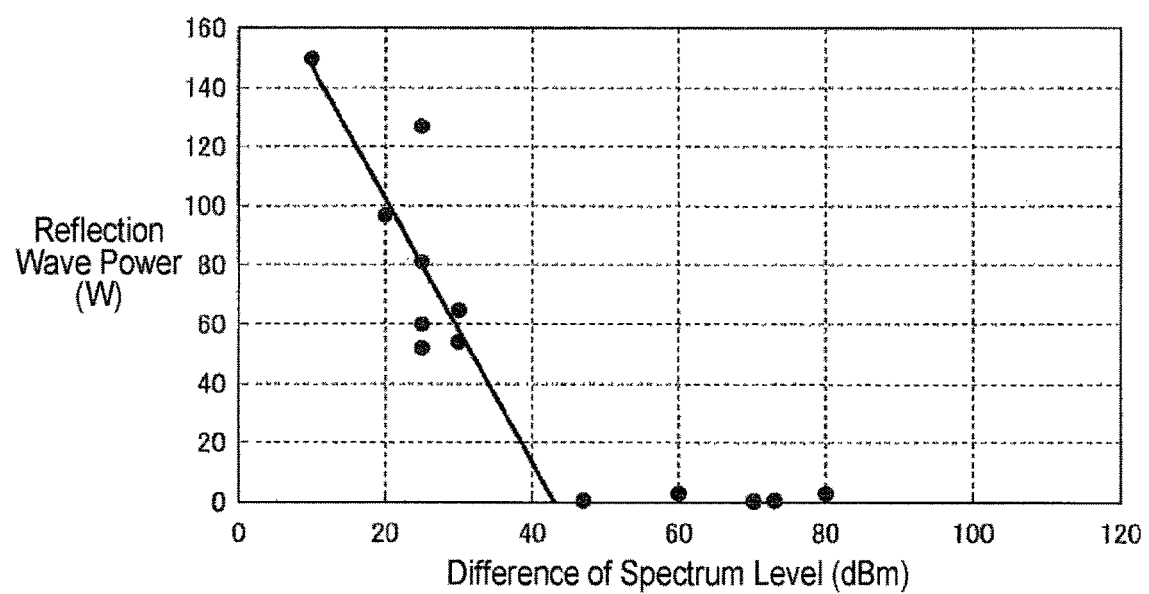
FIG. 8 is a graph representing a relationship between a difference between a fundamental frequency spectrum level and a different frequency spectrum level and a reflection wave power.

FIG. 8 is a graph illustrating a relationship between a difference between a spectrum level of a fundamental frequency component and a spectrum level of a different frequency component and a reflection wave power. Referring to FIG. 8, when the difference of the spectrum levels is 40.0 dBm or higher, the value of the reflection wave power is 0 (W). That is, no reflection wave power is generated. On the contrary, the reflection wave power is generated when the difference of the spectrum levels is lower than 40.0 dBm. Here, when the difference of the spectrum levels is 40 dBm or higher, it is found that no reflection wave power is generated. Accordingly, in the present exemplary embodiment, 40 dBm is set as the threshold. In addition, at the timing when the difference becomes lower than 40.0 dBm, the notifying device 62a issues notification, for example, by generating an alarm sound. This timing becomes a reference for a replacement timing of the magnetron 42. When the notification is issued by the notifying device 62a while a processed substrate W is being processed, the magnetron 42 may be replaced after the plasma processing is terminated. When the notification is issued, prior to performing the plasma processing on the processed substrate W, the magnetron 42 may be replaced prior to performing the plasma processing.

That is, according to the plasma processing apparatus 11 as described above, the state of the magnetron of the magnetron 42 is determined by the first determining section 61a serving as a determining mechanism, and the determination result is notified by the notifying device 62a serving as a notifying mechanism. Thus, the replacement timing of the magnetron 42 may be scheduled. As such, it is possible to avoid the situation that the replacement timing of the magnetron 42 is reached during the plasma processing. Accordingly, according to the plasma processing apparatus 11 as described above, the plasma processing may be efficiently performed.

In such a case, it is not necessary to particularly input an initial value to the determining mechanism. That is, the replacement timing of the magnetron 42 may be scheduled using the detected fundamental frequency component and different frequency component. Accordingly, convenience may be improved.

In such a case, because a part of the oscillation frequency signal of the magnetron 42 is branched and input from the branch portion 65a, the handleability of the frequency signal branched from the waveguide 60 can be improved.

In addition, referring to FIG. 8, it is found that as the difference between the spectrum levels is reduced, the reflection wave power tends to increase. Accordingly, the replacement timing of the magnetron 42 may be scheduled by setting the threshold to another value to be balanced with the magnitude of the reflection wave power.

In addition, because the band-pass filters 67a and 68a are used to perform filtering that allows only a predetermined frequency band to pass therethrough and removes other frequency bands, the filtering may be efficiently performed.

In addition, because the microwave generator 41a serving as a high frequency generator is provided with the magnetron 42 serving as a high frequency oscillator configured to oscillate high frequency waves, a determining mechanism configured to determine the state of the magnetron 42, and a notifying mechanism configured to perform notification of a determination result made by the determining mechanism, the life-span of the magnetron 42 or a replacement timing of a consumable product may be easily scheduled.

In the above-described exemplary embodiment, it has been described that a part of the oscillation frequency signal of the magnetron 42 is branched and input from the branch portion 65a provided in the waveguide 60. Without being limited thereto, however, a part of the oscillation frequency signal of the magnetron 42 may be branched and input from other routes.

Figure 9:
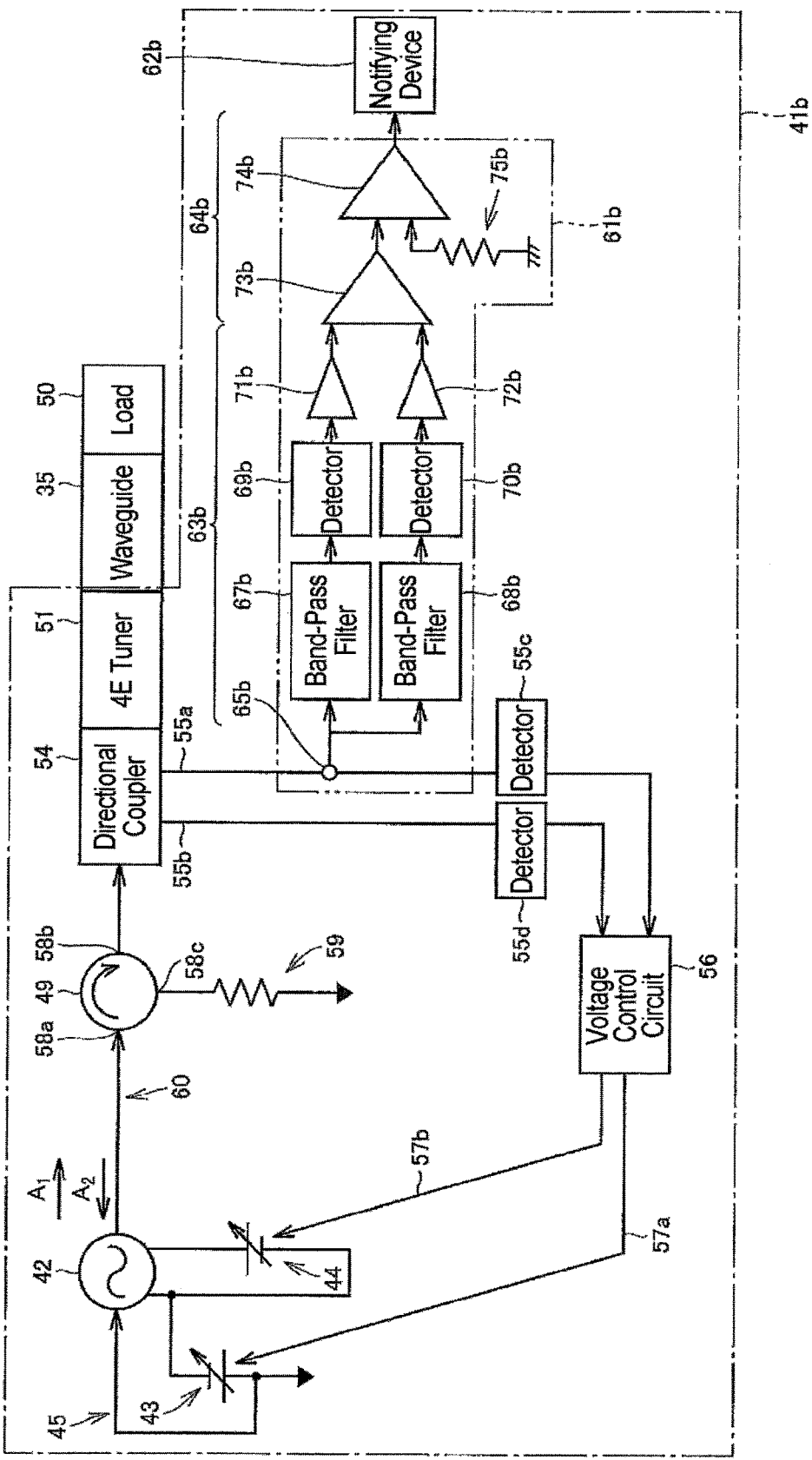
FIG. 9 is a block diagram illustrating a schematic configuration of a microwave generator included in a plasma processing apparatus according to another exemplary embodiment of the present disclosure.

FIG. 9 is a block diagram illustrating a schematic configuration of a microwave generator 41b provided in the plasma processing apparatus in such a case. FIG. 9 corresponds to FIG. 3. Meanwhile, because the configuration other than the determining mechanism included in the microwave generator 41b provided in the plasma processing apparatus according to still another exemplary embodiment of the present disclosure illustrated in FIG. 9 are the same as those of the plasma processing apparatus 11, descriptions thereof will be omitted.

Referring to FIG. 9, the microwave generator 41b provided in the plasma processing apparatus according to still another exemplary embodiment of the present disclosure includes a first determining section 61b serving as a determining mechanism configured to determine a state of a magnetron 42, and a notifying device 62b serving as a notifying mechanism configured to perform notification of a determination result made by the first determining section 61b. The first determining section 61b determines the state of the magnetron 42 based on a fundamental frequency component and a different frequency component which are oscillated from the magnetron 42.

The first determining section 61b includes a spectrum level detecting section 63b configured to detect a spectrum level of a fundamental frequency component and a spectrum level of a different frequency component, and a spectrum level comparing section 64b configured to compare a value of the spectrum level of the fundamental frequency component and a value of the spectrum level of the different frequency component which are detected by the spectrum level detecting section 63b. The spectrum level detecting section 63b includes a branch portion 65b provided on a way of a circuit 55a extending from a directional coupler 54 to a detector 55c, first and band-pass filters 67b and 68b configured to receive an input of a frequency signal branched and input from the branch portion 65b, a first detector 69b configured to detect a frequency that has passed through the first band-pass filter 67b, a second detector 70b configured to detect a frequency that has passed through the second band-pass filter 68b, a first gain adjusting amplifier 71b configured to amplify the frequency signal detected by the first detector 69b, and a second gain adjusting amplifier 72b configured to amplify the frequency signal detected by the second detector 70b. In addition, the spectrum level comparing section 64b includes a subtraction circuit 73b configured to calculate a difference between the frequency amplified by the first gain adjusting amplifier 71b and the frequency amplified by the second gain adjusting amplifier 72b, a comparator 74b configured to compare the value of the difference calculated by the subtraction circuit 73b and a threshold set as a predetermined value, and a threshold adjusting unit 75b configured to adjust the threshold which becomes a target to be compared by the comparator 74b.

Meanwhile, because the configuration of each of the first band-pass filter 67b, the second band-pass filter 68b, the first detector 69b, the second detector 70b, the first gain adjusting amplifier 71b, the second gain adjusting amplifier 72b, the subtraction circuit 73b, the comparator 74b, and the threshold adjusting unit 75b is the same as to that of the first band-pass filter 67a or the like in the exemplary embodiment illustrated in FIG. 3, descriptions thereof will be omitted.

This configuration may be acceptable. That is, as compared with the exemplary embodiment illustrated in FIG. 3, the substantial differences are the branched portion and existence/non-existence of the attenuator. With this arrangement, the attenuator may be omitted as compared to the exemplary embodiment in FIG. 3. Accordingly, an inexpensive configuration may be obtained.

Meanwhile, in the above-described exemplary embodiment, the spectrum level comparing section included in the microwave generator includes the subtraction circuit, the comparator, and the threshold adjusting unit. Without being limited thereto, comparison may be made, for example, by converting input analog data into digital data.

Figure 10:
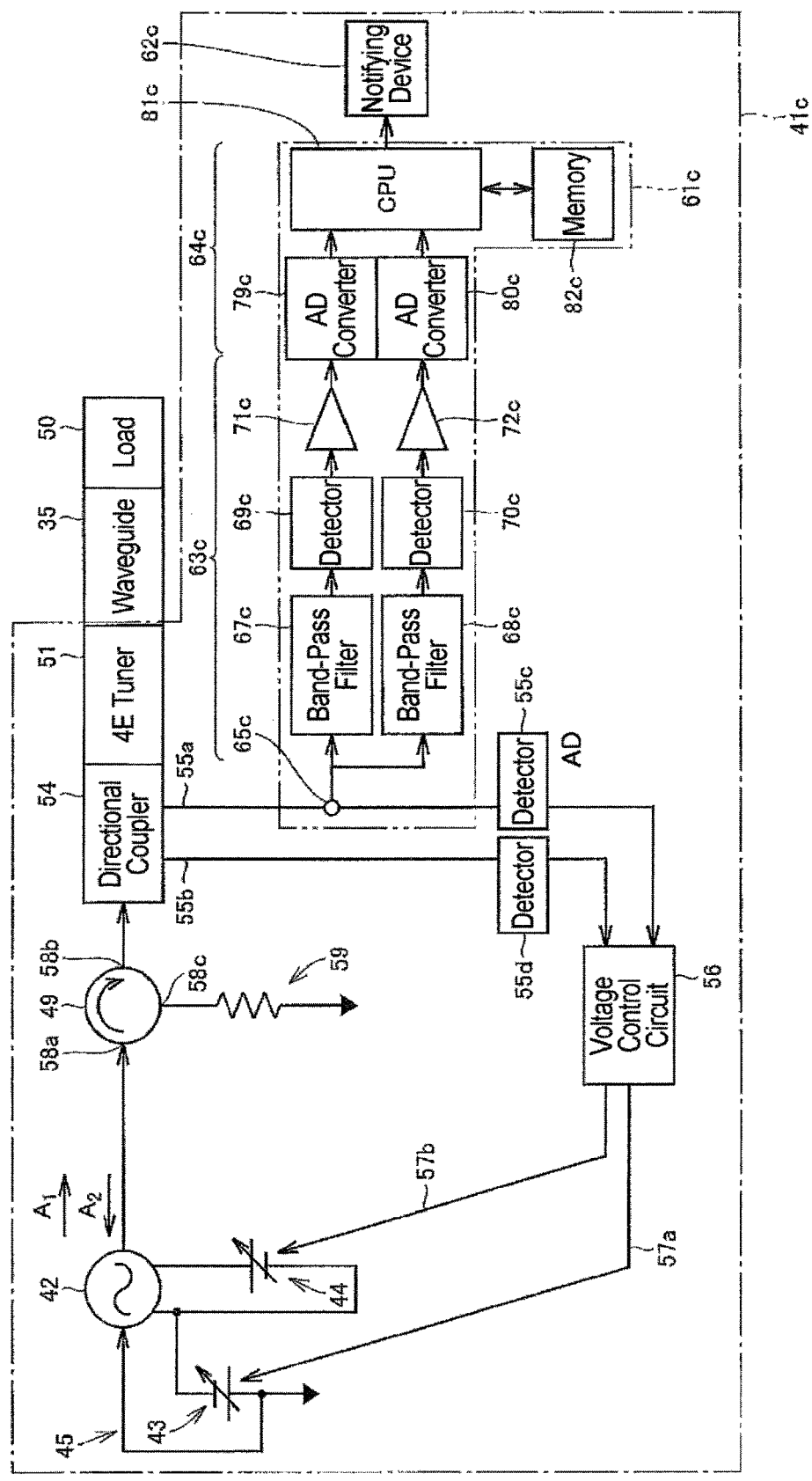
FIG. 10 is a block diagram illustrating a schematic configuration of a microwave generator included in a plasma processing apparatus according to still another exemplary embodiment of the present disclosure.

FIG. 10 is a block diagram illustrating a schematic configuration of a microwave generator 41c provided in the plasma processing apparatus in such a case. FIG. 10 corresponds to FIGS. 3 and 9. Meanwhile, because the configuration other than the determining mechanism included in the microwave generator 41c provided in the plasma processing apparatus according to still another exemplary embodiment of the present disclosure illustrated in FIG. 10 are the same as those of the plasma processing apparatus 11, descriptions thereof will be omitted.

Referring to FIG. 10, the microwave generator 41c provided in the plasma processing apparatus according to still another exemplary embodiment of the present disclosure includes a first determining section 61c serving as a determining mechanism configured to determine a state of a magnetron 42, and a notifying device 62c serving as a notifying mechanism configured to perform notification of a determination result made by the first determining section 61b. The first determining section 61c determines the state of the magnetron 42 based on a fundamental frequency component and a different frequency component which are oscillated from the magnetron 42.

The first determining section 61c includes a spectrum level detecting section 63c configured to detect a spectrum level of a fundamental frequency component and a spectrum level of a different frequency component, and a spectrum level comparing section 64c configured to compare a value of the spectrum level of the fundamental frequency component and a value of the spectrum level of the different frequency component which are detected by the spectrum level detecting section 63c. The spectrum level detecting section 63c includes a branch portion 65c provided on a way of a circuit 55a extending from a directional coupler 54 to a detector 55c, first and band-pass filters 67c and 68c configured to receive an input of a frequency signal branched and input from the branch portion 65c, a first detector 69c configured to detect a frequency that has passed through the first band-pass filter 67c, a second detector 70c configured to detect a frequency that has passed through the second band-pass filter 68c, a first gain adjusting amplifier 71c configured to amplify the frequency signal detected by the first detector 69c, a second gain adjusting amplifier 72c configured to amplify the frequency signal detected by the second detector 70c, a first AD converter 79c configured to perform AD conversion of the frequency amplified by the first gain adjusting amplifier 71c, and a second AD converter 80c configured to perform AD conversion of the frequency amplified by the second gain adjusting amplifier 72c. In addition, the spectrum level comparing section 64c includes a CPU 81c to which the digital data converted by the first and second AD converters 79c and 80c, and a memory 82c serving as a storage unit that stores data and may exchange data with the CPU 81c.

Because the configuration of each of the first band-pass filter 67c, the second band-pass filter 68c, the first detector 69c, the second detector 70c, the first gain adjusting amplifier 71c, and the second gain adjusting amplifier 72c is similar to that of the first band-pass filter 67a or the like in the exemplary embodiment illustrated in FIG. 3, descriptions thereof will be omitted. The analog data of the frequency amplified by the first gain adjusting amplifier 71c is converted into digital data by the first AD converter 79c. Likewise, the analog data of the frequency amplified by the second gain adjusting amplifier 72c is converted into digital data by the second AD converter 80c. That is, each analog data is AD-converted. Then, the digital data of each of the AD-converted frequencies is input to the CPU 81c. Here, a threshold is stored in the memory 82c. The CPU 81c acquires the threshold from the memory 82c and performs an arithmetic operation using the input digital data of each of the frequencies. Specifically, a difference between a value of the digital data input by the first AD converter 79c and a data of the digital data input by the second AD converter 80c is calculated, and the value of the difference obtained thereby and the threshold acquired from the memory 82c are compared with each other. According to the exemplary embodiment illustrated in, for example, FIG. 8, the threshold is digital data corresponding to 40.0 dBm. Then, the determination result obtained by the comparison is notified by the notifying device 62c.

This configuration may be acceptable. With this configuration, the digital data may be stored in the memory 82c, and the data may be acquired for an efficient use such as, for example, management or recording of the state of the magnetron 42. In addition, an arbitrary value may be easily set, for example when setting a threshold or inputting digital data.

In the exemplary embodiment, the determining mechanism is configured to include the first determining section which determines the state of the high frequency oscillator based on the fundamental frequency component and the different frequency component which are oscillated from the high frequency oscillator. Without being limited thereto, however, the determining mechanism may be configured to include the second determining section which determines the state of the high frequency oscillator based on the initial frequency of the fundamental waves oscillated from the high frequency oscillator.

The inventors have made intensive studies on determination of a state of magnetrons based on an initial frequency of fundamental waves. Since magnetrons 42 are manufactured by assembling mechanically machined components as described above, values of oscillating frequencies are slightly different from each other depending on microwave powers applied thereto. Specifically, there are frequency variations in the order of approximately ±7 MHz with respect to a target frequency. Further, through repeated tests, the following knowledge was obtained.

Figure 11:
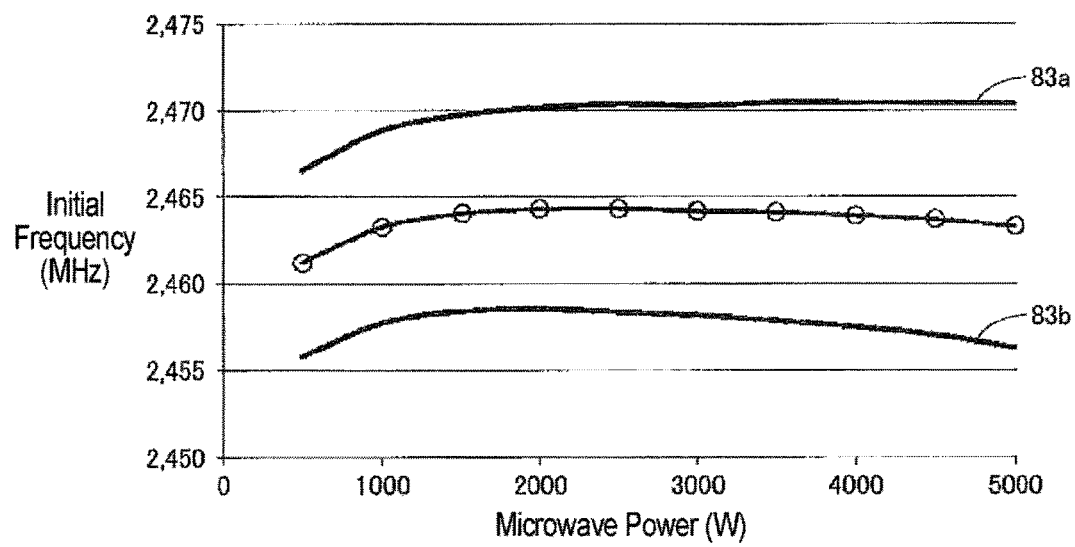
FIG. 11 is a graph representing a relationship between an initial frequency and a microwave power of a magnetron.

FIG. 11 is a graph representing a relationship between an initial frequency and a microwave power of a magnetron 42. In FIG. 11, the vertical axis represents initial frequency and the horizontal represents microwave power (W). The test in the graph was performed on 100 magnetrons (i.e., n=100). An initial frequency corresponding to each microwave power was measured per each 500 W and the initial frequencies are indicated by white round marks in FIG. 11. Meanwhile, for reference, a +3 sigma value and a −3 sigma value of the initial frequency are represented by lines 83a and 83b, respectively. Accordingly, when the frequency variation exceeds ±7 MHz over the initial frequency, more preferably when exceeding ±5 MHz, it is a replacement timing.

Referring to FIG. 11, the value of the initial frequency is relatively low at a relatively low power value in a range up to approximately 1500 W, reaches a peak in the vicinity of 2000 W, and gradually decreases as the microwave power increases from the vicinity of 3000 W.

Figure 12:
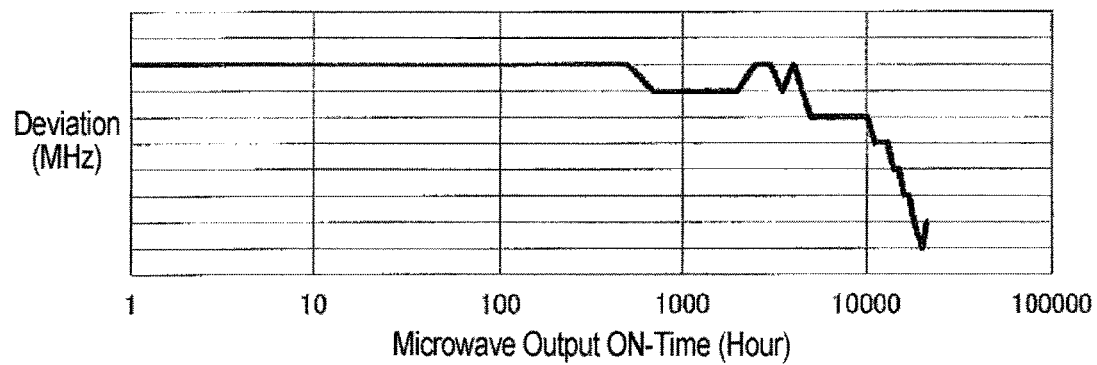
FIG. 12 is a graph representing a relationship between a deviation from the initial frequency of the magnetron and a microwave output ON-time.

FIG. 12 is a graph representing a relationship between a deviation from the initial frequency of the magnetron 42 and a microwave output ON-time when 5000 W is applied. The vertical axis represents a deviation from the initial frequency of the magnetron 42 and the horizontal axis represents a microwave output ON-time. The vertical axis represents deviation at 1 MHz intervals. In addition, the ON-time is represented exponentially.

Referring to FIG. 12, a change occurs in frequency deviation before and after 1000 hours, and the deviation is remarkably varied from the ON-time slightly after 10000 hours. Specifically, the deviation is lowered by several MHz approximately step by step. Accordingly, for example, the magnetron replacement timing will be slightly after 10000 hours. The value of deviation at this time will be about 2.

Figure 13:
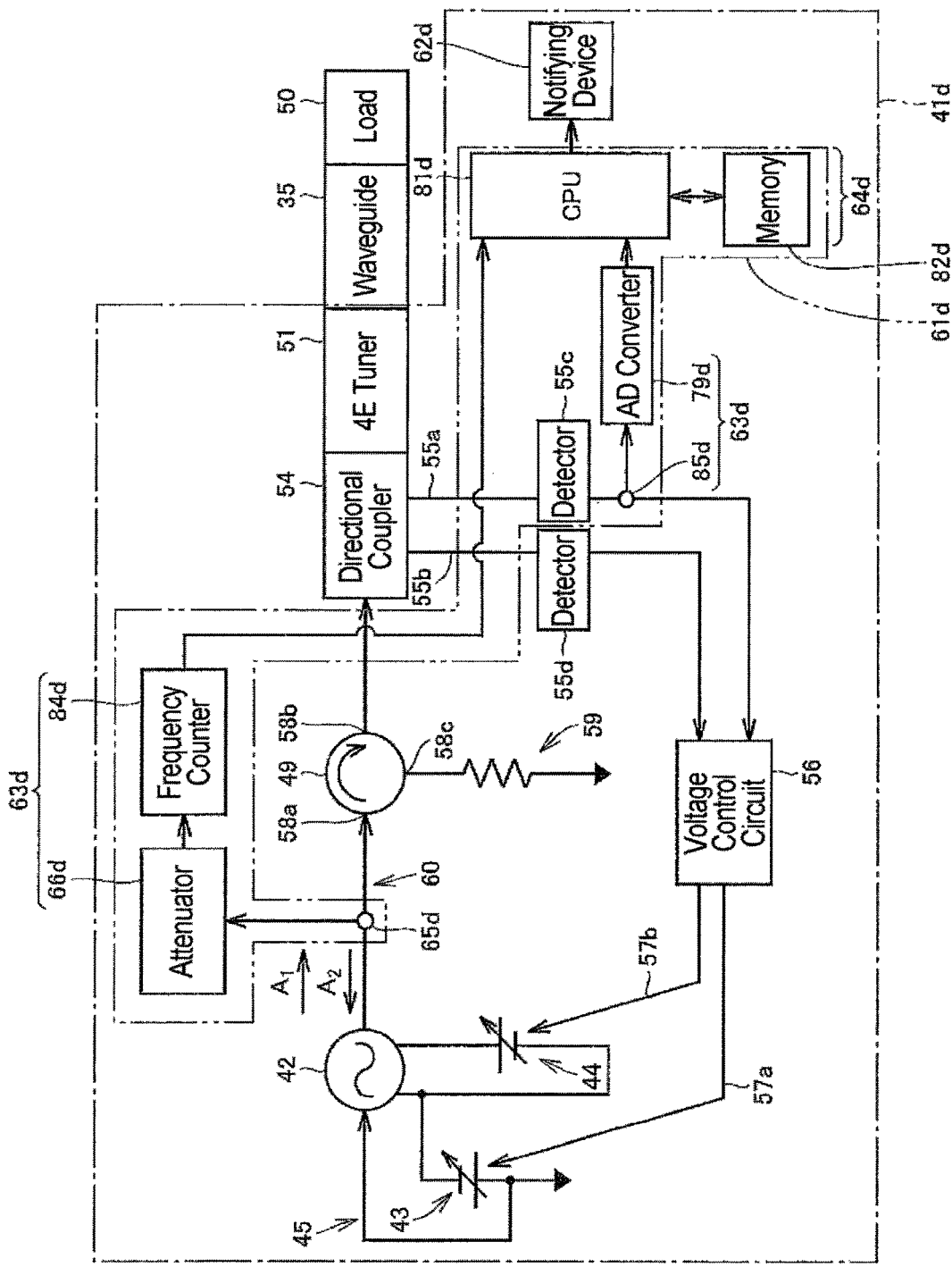
FIG. 13 is a block diagram illustrating a schematic configuration of a microwave generator provided in a plasma processing apparatus according to still another exemplary embodiment of the present disclosure.

FIG. 13 is a block diagram illustrating a schematic configuration of a microwave generator 41d provided in a plasma processing apparatus according to still another exemplary embodiment of the present disclosure. FIG. 13 corresponds to the drawings illustrated in, for example, FIGS. 3 and 9. Meanwhile, the configuration included in the microwave generator 41d provided in the plasma processing apparatus according to still another exemplary embodiment of the present invention is similar to that of the plasma processing apparatus 11, except for the determining mechanism, and thus the description thereof will be omitted.

Referring to FIG. 13, the microwave generator 41d provided in the plasma processing apparatus according to still another exemplary embodiment of the present invention includes a second determining section 61d serving as a determining mechanism that determines the state of a magnetron 42, and a notifying device 62d serving as a notifying mechanism that performs notification of the determination result made by the second determining section 61d. The second determining section 61d determines the state of the magnetron 42 based on the initial frequency of a fundamental wave oscillated from the magnetron 42.

The second determining section 61d includes a frequency detecting unit 63d configured to detect the initial frequency of the fundamental wave and the current frequency of the fundamental wave, and a frequency comparing unit 64d configured to compare the initial frequency and the current frequency of the fundamental wave detected by the frequency detecting unit 63d. The frequency detecting unit 63d includes a branch portion 65d provided on the way of the waveguide 60, an attenuator 66d configured to attenuate a frequency signal branched and input from the branch portion 65d, a frequency counter 84d configured to count a frequency based on the frequency signal input from the attenuator 66d, a branch portion 85d provided on the way of a circuit 55a extending from a detector 55c to a voltage control circuit 56, and an AD converter 79d configured to AD-convert a frequency signal branched and input from the branch portion 85d. In addition, the frequency comparing unit 64d includes a CPU 81d to which digital data of the initial frequency of the fundamental wave obtained by the frequency counter and digital data converted by the AD converter 79d are input, and a memory 82d configured to be capable of exchanging data with the CPU 81d and serve as a storage unit that stores data.

Each component such as, for example, the attenuator 66d or the AD converter 79d is the same as, for example, the attenuator 63a, in the exemplary embodiment illustrated in FIG. 3, and thus the descriptions thereof will be omitted. Digital data from the frequency counter 84d and digital data of an AD-converted frequency are input to the CPU 81d. Here, a threshold of the frequency deviation is stored in the memory 82d. The CPU 81d acquires the threshold of the frequency deviation from the memory 82d, and performs an arithmetic operation using the digital data of the input frequency. Specifically, because initial frequencies are different according to microwave powers as illustrated in FIG. 11, the initial frequencies related to microwave powers are recorded in the memory 82d. A microwave power signal obtained from the directional coupler 54 and the detector 55c is branched from the portion 85d and converted into a digital signal by the AD converter 79d to be input to the CPU 81d. The currently oscillated frequency is branched from the branch portion 65d and attenuated by the attenuator 66d, and then input to the frequency counter 84d to be input to the CPU 81d. The CPU 81d reads a frequency related to an initial microwave power and recorded in the memory 82d and calculates a difference and calculates a difference between the frequency related to the initial microwave power and the frequency related to the current microwave power. And, the difference is compared with the threshold previously recorded in the memory 82d. Meanwhile, because initial values and thresholds related to microwave powers which are recorded in the microwaves memory 82d are discrete values, when an intermediate value is taken as the microwave power, the CPU 81d calculates the initial frequency according to proportional division from the current microwave power. According to the above described exemplary embodiment illustrated in FIG. 12, for example, "2" is selected as a deviation value. In addition, the determination result based on comparison is notified by the notifying device 62d.

This configuration may be acceptable. With this configuration, the replacement timing of the magnetron 42 may be scheduled in consideration of the determination result of the state of the magnetron 42. Then, it is possible to avoid the situation that the replacement timing is reached during the plasma processing. Accordingly, with this plasma processing apparatus, the plasma processing may be efficiently performed.

In this case, digital data may be stored by the memory 82d, and the data may be acquired and effectively used. In addition, when, for example, a threshold is set, an arbitrary value may be easily set, for example, by inputting the digital data.

Meanwhile, in the above-described exemplary embodiment, a part of the oscillation frequency signal of the magnetron 42 is branched to be input from each of the branch portions provided in the waveguide 60 and the circuit 55a. Without being limited thereto, however, a part of the oscillation signal of the magnetron may be branched to be input only from the branch portion provided in the waveguide 60.

Figure 14:
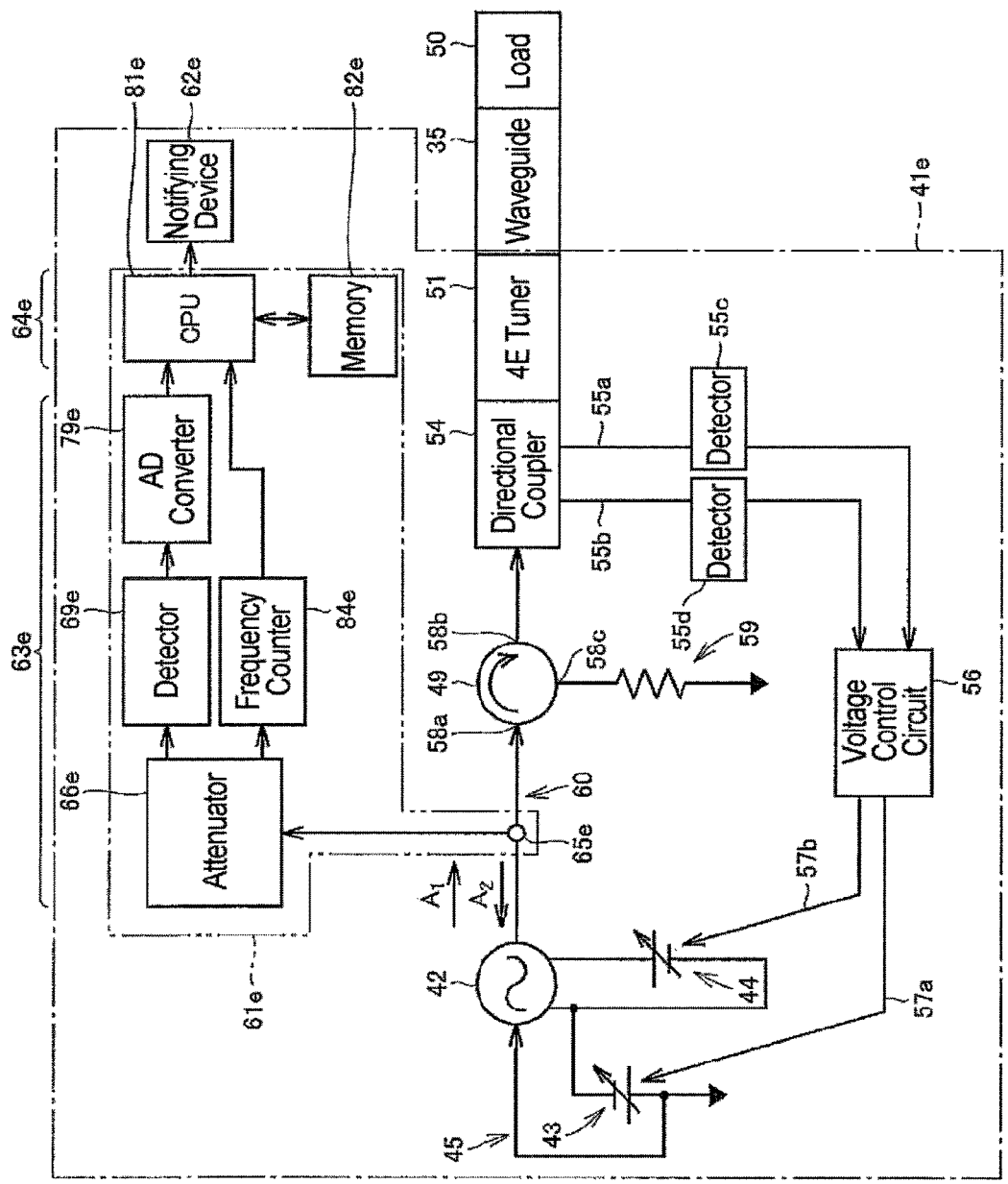
FIG. 14 is a block diagram illustrating a schematic configuration of a microwave generator provided in a plasma processing apparatus according to still another exemplary embodiment of the present disclosure.

FIG. 14 is a block diagram illustrating a schematic configuration of a microwave generator 41e provided in the plasma processing apparatus in the just described case. FIG. 14 corresponds to the drawing illustrated in, for example, FIG. 3. Meanwhile, the configuration other than a determining mechanism included in a microwave generator 41e provided in the plasma processing apparatus according to still another exemplary embodiment of the present disclosure as illustrated in FIG. 14 is the same as that in the plasma processing apparatus 11, descriptions thereof will be omitted.

Referring to FIG. 14, the microwave generator 41e provided in the plasma processing apparatus according to still another exemplary embodiment of the present invention includes a second determining section 61e serving as a determining mechanism that determines a state of the magnetron 42, and a notifying device 62e serving as a notifying mechanism that performs notification of a determination result made by the second determining section 61e. The second determining section 61e determines the state of the magnetron 42 based on an initial frequency of a fundamental wave oscillated from the magnetron 42.

The second determining section 61e includes a frequency detecting unit 63e configured to detect the initial frequency of the fundamental wave and a current frequency of the fundamental wave, and a frequency comparing unit 64e configured to compare the initial frequency and the current frequency of the fundamental wave which are detected by the frequency detecting unit 63e. The frequency detecting unit 63e includes a branch portion 65e provided on the way of a waveguide 60, an attenuator 66e configured to attenuate a frequency signal branched and input from the branch portion 65e, a frequency counter 84e configured to count the current frequent based on the frequency signal input from the attenuator 66e, a second detector 69e configured to detect the initial frequency based on the frequency signal input from the attenuator 66e, and an AD converter 79e configured to AD-convert the frequency signal input from the second detector 69e. In addition, the frequency comparing unit 64e includes a CPU 81e to which digital data of the initial signal of the fundamental wave obtained by the frequency counter 84e and the digital data converted by the AD converter 79e are input, and a memory 82e capable of exchanging data with the CPU 81e and serving as a storage unit that stores the data.

Because each component such as, for example, the attenuator 66e, is the same as the component such as, for example, the attenuator 63a, in the exemplary embodiment illustrated in FIG. 3, the descriptions thereof will be omitted. The digital data from the frequency counter 84e and the digital data of the AD-converted frequency are input to the CPU 81e. Here, a threshold of frequency deviation is stored in the memory 82e. The CPU 81e performs an arithmetic operation by acquiring the threshold of the frequency deviation from the memory 82e and using the digital data of the input frequency. Specifically, as illustrated in FIG. 11, because initial frequencies are different according to microwave powers, initial frequencies are recorded in the memory 82e in relation to microwave powers. The frequency signal branched at the branch portion 65d on the wave guide 60 is subjected to voltage adjustment in the attenuator 66e and the detector 69e, converted into a digital signal by the AD converter 79e and input to the CPU 81e. The currently oscillated frequency is branched from the branch portion 65e, attenuated by the attenuator 66e, and then input to the frequency counter 84e to be input to the CPU 81e. The CPU 81e reads a frequency related to an initial microwave power which is recorded in the memory 82e, calculates a difference between the frequency related to the initial microwave power and a frequency related to the current microwave power, and compares the difference with the threshold previously recorded in the memory 82e. Meanwhile, because the initial values and thresholds related to microwave powers which are recorded in the microwaves memory 82e are discrete values, when an intermediate value is taken as the microwave power, the CPU 81e calculates the initial frequency from the current microwave according to proportional division. According to the above described exemplary embodiment illustrated in FIG. 12, for example, "2" is selected as a deviation value. In addition, the determination result based on comparison is notified by the notifying device 62e.

This configuration is acceptable. With this configuration, the replacement typing of the magnetron may also be scheduled in consideration of the determination result of the state of the magnetron 42. Then, it is possible to avoid the situation that the replacement timing is reached during the plasma processing. Accordingly, with this plasma processing apparatus, the plasma processing may be efficiently performed.

In this case, digital data may also be stored by the memory 82e, and the data may be acquired and effectively used. In addition, when, for example, a threshold is set, an arbitrary value may be easily set, for example, by inputting the digital data.

In addition, a part of the oscillated signal of the magnetron 42 may be branched and input only from the branch portion provided in circuit 55a.

Figure 15:
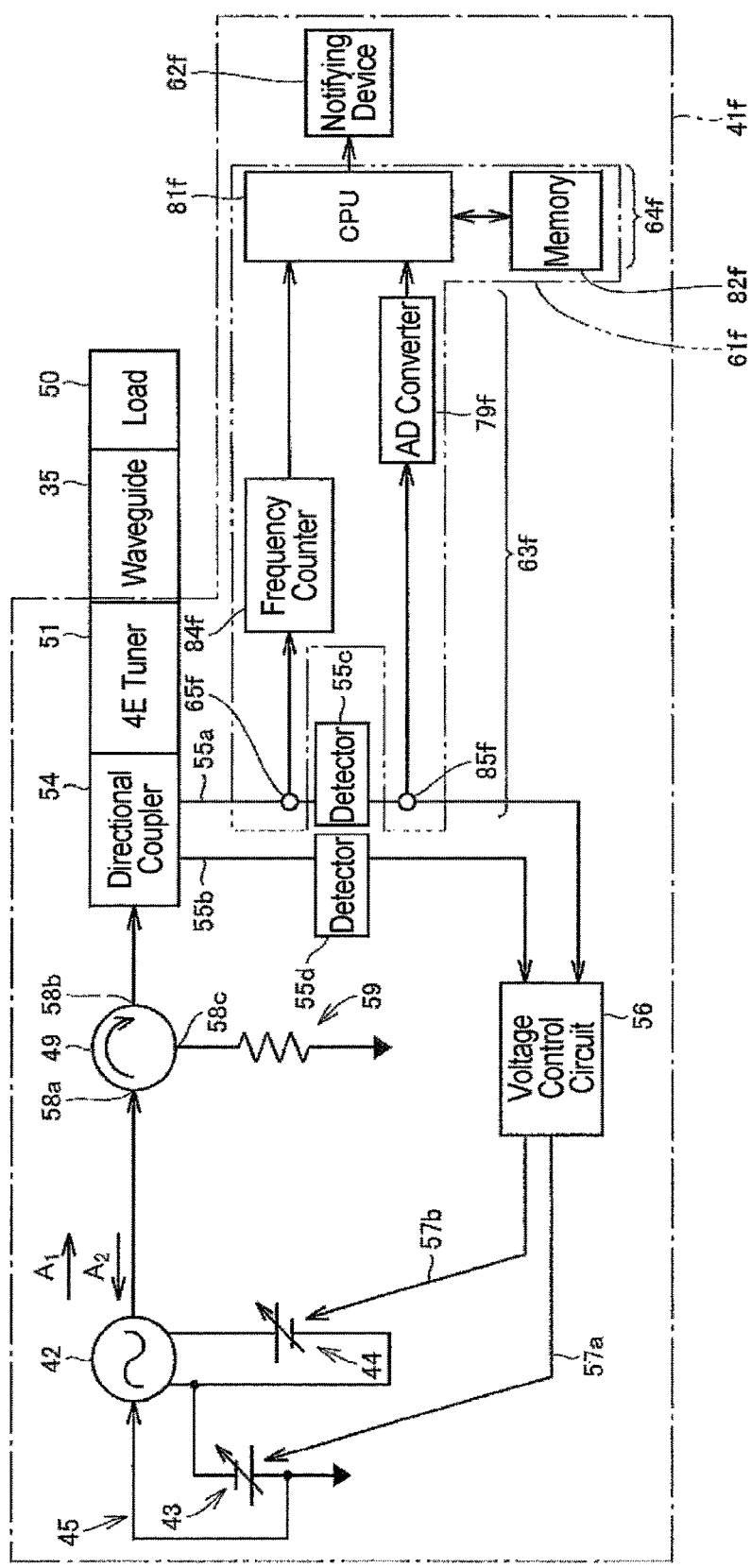
FIG. 15 is a block diagram illustrating a schematic configuration of a microwave generator provided in a plasma processing apparatus according to still another exemplary embodiment of the present disclosure.

FIG. 15 is a block diagram illustrating a schematic configuration of a microwave generator 41f provided in the plasma processing apparatus in the just described case. FIG. 15 corresponds to the drawing illustrated in, for example, FIG. 3. Meanwhile, the configuration other than a determining mechanism included in a microwave generate 41f provided in a plasma processing apparatus according to yet another exemplary embodiment of the present disclosure as illustrated in FIG. 15 is the same as that in the plasma processing apparatus 11, descriptions thereof will be omitted.

Referring to FIG. 15, the microwave generator 41f provided in the plasma processing apparatus according to yet another exemplary embodiment of the present invention includes a second determining section 61f serving as a determining mechanism that determines a state of the magnetron 42, and a notifying device 62f serving as a notifying mechanism that performs notification of a determination result made by the second determining section 61f. The second determining section 61f determines the state of the magnetron based on an initial frequency of a fundamental wave oscillated from the magnetron 42.

The second determining section 61f includes a frequency detecting unit 63f configured to detect the initial frequency of the fundamental wave and a current frequency of the fundamental wave, and a frequency comparing unit 64f configured to compare the initial frequency and the current frequency of the fundamental wave which are detected by the frequency detecting unit 63e. The frequency detecting unit 63f includes two branch portions 65f and 85f provided on the way of a waveguide 60, a frequency counter 84f configured to count the current frequent signal based on a frequency signal branched and input from the branch portion 65f positioned at the directional coupler 54 side, a second detector 55c configured to detect a frequency signal branched and input from the branch portion 85f positioned at the voltage control circuit 85 side, and an AD converter 79f configured to AD-convert the frequency signal input from the second detector 55c. In addition, the frequency comparing unit 64f includes a CPU 81f to which digital data of the initial signal of the fundamental wave obtained by the frequency counter 84f and the digital data converted by the AD converter 79f are input, and a memory 82f capable of exchanging data with the CPU 81f and serving as a storage unit that stores the data.

Because each component such as, for example, the AD converter 79c, is the same as each component, such as the AD converter 79c in the exemplary embodiment illustrated in FIG. 10, the descriptions thereof will be omitted. The digital data from the frequency counter and the digital data of the AD-converted frequency are input to the CPU 81f. Here, a threshold of frequency deviation is stored in the memory 82f. The CPU 81f performs an arithmetic operation by acquiring the threshold of the frequency deviation from the memory 82f and using the digital data of the input frequency. Specifically, as illustrated in FIG. 11, because initial frequencies are different according to microwave powers, initial frequencies are recorded in the memory 82e in relation to microwave powers. The microwave power signals obtained from the directional coupler 54 and the detector 55c are branched from the branch portion 85f, converted into a digital signal by the AD converter 79f, and input to the CPU 81e. The currently oscillated frequency is branched from the branch portion 65f, input from the branch portion 65f to the frequency counter 84f to be input to the CPU 81f. The CPU 81f reads a frequency related to an initial microwave power which is recorded in the memory 82f, calculates a difference between the frequency related to the initial microwave power and a frequency related to the current microwave power, and compares the difference with the threshold previously recorded in the memory 82f. Meanwhile, because the initial values and thresholds related to microwave powers which are stored in the microwaves memory 82f are discrete values, when an intermediate value is taken as the microwave power, the CPU 81f calculates the initial frequency from the current microwave according to proportional division. According to the above described exemplary embodiment illustrated in FIG. 12, for example, "2" is selected as a deviation value. In addition, the determination result based on comparison is notified by the notifying device 62f. This configuration is acceptable.

In addition, although in the just described exemplary embodiment, the determining mechanism is configured to include the second determining section configured to determine the state of the high frequency oscillator based on the frequency of the fundamental wave oscillated from the high frequency oscillator. Without being limited thereto, the determining mechanism may be configured to include a third determining section configured to determine the state of the high frequency oscillator based on the efficiency of the high frequency oscillator.

The inventors have made intensive studies on determination of states of magnetrons 42 based on efficiencies of the magnetrons 42. Since the magnetrons 42 are manufactured by assembling mechanically machined components as described above, values of initial efficiencies are slightly different from each other depending on microwave powers applied thereto. Thus, the following knowledge was obtained.

Figure 16:
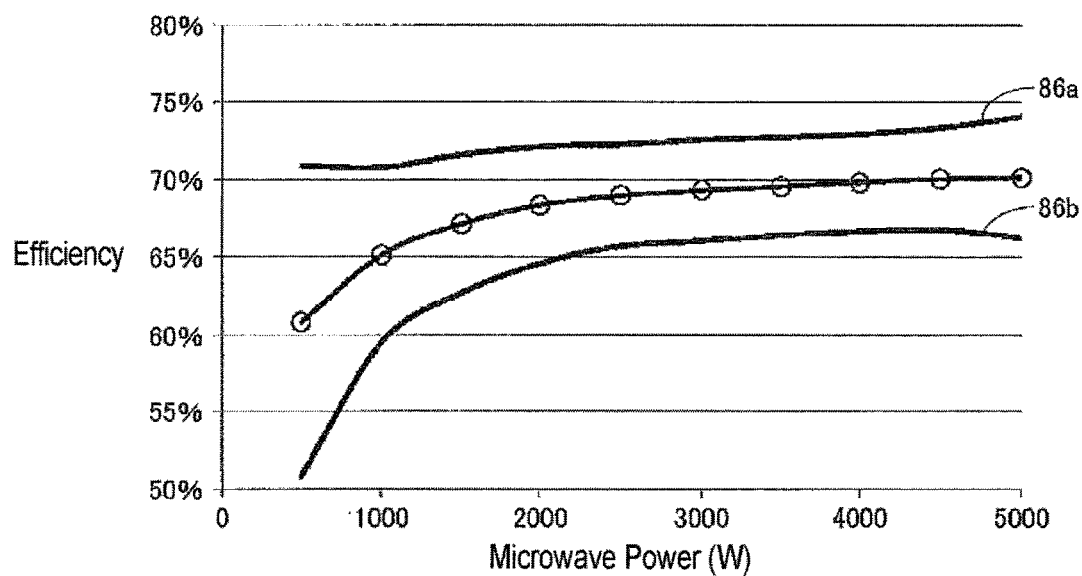
FIG. 16 is a graph representing a relationship between an initial efficiency and a microwave power of a magnetron.

FIG. 16 is a graph representing a relationship between an initial efficiency and a microwave power of a magnetron 42. In FIG. 16, the vertical axis represents initial efficiency (%) and the horizontal represents microwave power (W). The test in the graph was performed on 100 magnetrons (i.e., n=100). An initial frequency corresponding to each microwave power was measured per each 500 W and the initial frequencies are indicated by white round marks in FIG. 16. Meanwhile, for reference, a +3 sigma value and a −3 sigma value of the initial frequency are represented by lines 86a and 86b, respectively.

Referring to FIG. 16, at 1500 W or higher, the initial efficiency exhibits variation of about ±3% in value. At 1000 W or lower, the variation in value is increased.

Figure 17:
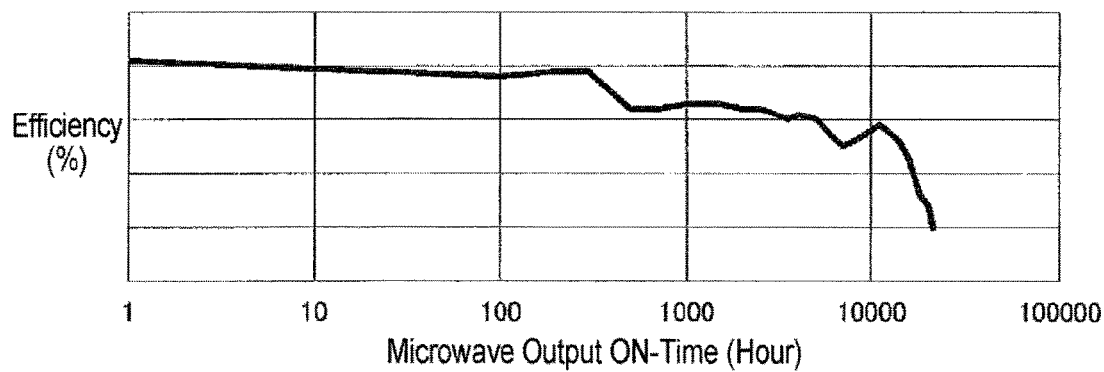
FIG. 17 is a graph representing a relationship between a deviation from the initial frequency and a microwave output ON-time.

FIG. 17 is a graph representing a relationship between a deviation from the initial frequency of the magnetron 42 and a microwave output ON-time when 5000 W is applied. The vertical axis represents a deviation from the initial efficiency of the magnetron 42 and the horizontal axis represents a microwave output ON-time. The vertical axis represents deviation at 1% intervals. In addition, the ON-time is represented exponentially.

Referring to FIG. 17, a change occurs in deviation before and after 1000 hours so that the efficiency is decreased about 1%. The deviation is greatly varied from the ON-time slightly after 10000 hours. Specifically, the deviation is lowered by several MHz approximately step by step. Accordingly, for example, the magnetron replacement timing will be slightly after 10000 hours. The value of deviation at this time will be about 2.

Figure 18:
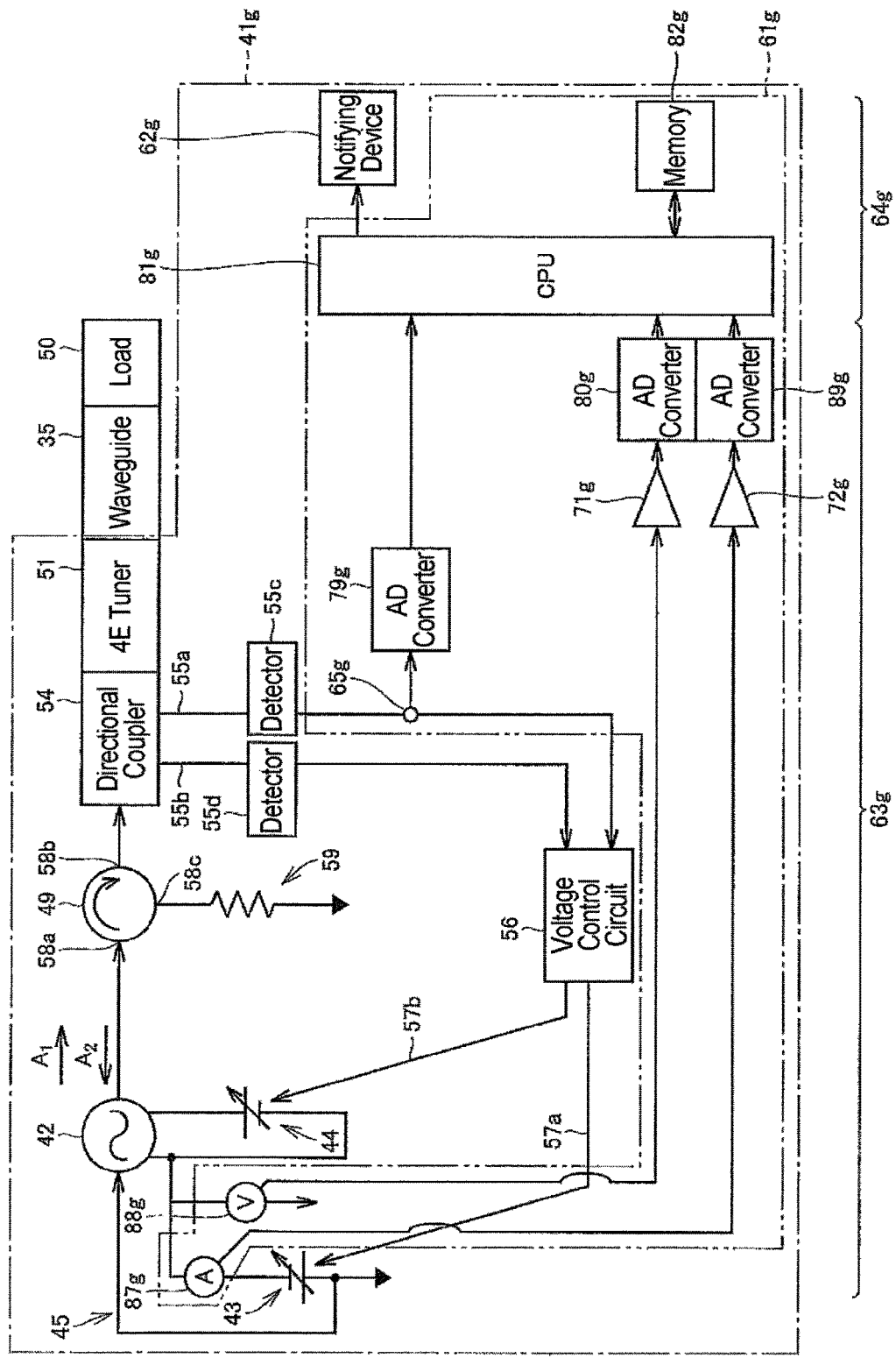
FIG. 18 is a block diagram illustrating a schematic configuration of a microwave generator provided in a plasma processing apparatus according to yet another exemplary embodiment of the present disclosure.

FIG. 18 is a block diagram illustrating a schematic configuration of a microwave generator 41g provided in a plasma processing apparatus according to yet another exemplary embodiment of the present disclosure. FIG. 18 corresponds to drawings illustrated in, for example, FIGS. 3 and 9. Meanwhile, the configuration other than the determining mechanism included in the microwave generator 41g provided in the plasma processing apparatus according to yet another exemplary embodiment of the present invention is the same as that of the plasma processing apparatus 11, and thus descriptions thereof will be omitted.

Referring to FIG. 18, the microwave generator 41g provided in the plasma processing apparatus according to yet another exemplary embodiment of the present invention includes a third determining section 61g serving as a determining mechanism that determines the state of a magnetron 42, and a notifying device 62g serving as a notifying mechanism that performs notification of the determination result made by the second determining section 61g. The third determining section 61g determines the state of the magnetron 42 based on the initial efficiency of a fundamental wave oscillated from the magnetron 42.

The third determining section 61g includes an efficiency detecting unit 63g configured to detect the initial efficiency of the fundamental wave of the magnetron 42 and the current efficiency of the magnetron, and a efficiency comparing unit 64g configured to compare the initial efficiency of the magnetron 42 and the current efficiency of the magnetron detected by the efficiency detecting unit 63g.

In addition, the efficiency detecting unit 63g includes a branch portion 65g provided on the way of a circuit 55a, an AD converter 79g configured to AD-convert a frequency signal branched and input from the branch portion 65g, an anode current measuring unit 87g configured to measure an anode current supplied from a high voltage power supply 43 side to the magnetron 42 side, an anode voltage measuring unit 88g configured to measure an anode voltage when the anode current is supplied; a first gain adjusting amplifier 72g configured to amplifier the current value input from the anode current measuring unit 87g; a second gain adjusting amplifier 71g configured to amplify the voltage value input from the anode voltage measuring unit 88g; a first AD converter 89g configured to AD-convert the anode current value amplified by the first gain adjusting amplifier 72g; and a second AD converter 80g configured to AD-convert the anode voltage value amplified by the second gain adjusting amplifier 71g. In addition, the efficiency comparing unit 64g includes a CPU 81g to which digital data converted by the first and second AD converters 89g and 80g, and a memory 82g configured to be capable of exchanging data with the CPU 81g and serve as a storage unit that stores data.

Each component such as, for example, AD converter is the same as, for example, the AD converter in the exemplary embodiment illustrated in FIG. 10, and thus the descriptions thereof will be omitted. An AD-converted input power value, and digital data of an anode current and an anode voltage are input to the CPU 81g. Here, a threshold of deviation from the initial efficiency is stored in the memory 82g. The CPU 81d acquires the threshold of the frequency deviation from the memory 82d, and performs an arithmetic operation using the digital data of, for example, the input anode current value. Specifically, because initial efficiencies are different according to microwave powers as illustrated in FIG. 16, the initial efficiencies related to the microwave powers are stored in the memory 82g. A microwave power signal obtained from the directional coupler 54 and the detector 55c is branched from the portion 65g and converted into a digital signal by the AD converter 79g to be input to the CPU 81g as a microwave power. With respect to the anode current, an anode current from the anode voltage measuring unit 88g is converted into a digital signal through the first gain adjusting amplifier 72g and the AD converter 89g and input to the CPU 81g as the anode current. With respect to the anode voltage, an anode voltage from the anode voltage measuring unit 88g is converted into a digital signal through the second gain adjusting amplifier 71g and the AD converter 80g and input to the CPU 81g as an anode voltage. With respect to the efficiency of the magnetron, a product of the anode voltage and the anode current which are input to the magnetron becomes an input power. In addition, a practically obtained microwave power becomes an output power. In addition, a quotient obtained by dividing the output power by the input power is calculated at the efficiency. The CPU 81g reads the efficiency related to the initial microwave power which is recorded in the memory 82g, calculates a difference between the efficiency related to the initial microwave power and the efficiency related to the current microwave power, and compares the difference with the threshold previously recorded in the memory 82g. Meanwhile, because initial efficiencies and thresholds related to initial microwaves which are recorded in the memory 82g are discrete values, when an intermediate value is taken as the microwave power, the CPU 81g calculates the initial efficiency according to proportional division from the current microwave power. According to the exemplary embodiment illustrated in FIG. 17, the threshold is 1% to 2% as a deviation value. In addition, the determination result based on comparison is notified by the notifying device 62g.

In this manner, the replacement timing of the magnetron 42 may also be scheduled in consideration of the determination result of the state of the magnetron 42. Then, it is possible to avoid the situation that the replacement timing is reached during the plasma processing. Accordingly, with this plasma processing apparatus, the plasma processing may be efficiently performed.

In addition, although the anode voltage is input from the anode voltage measuring unit 88g and through the second gain adjusting amplifier 71g and the AD converter 80g to the CPU 81g, a voltage command from a voltage control circuit 56 which controls the high voltage power supply 43 that generates the anode voltage may be AD-converted by the AD converter to be input to the CPU 81g. As such, because the anode voltage measuring unit 88g becomes needless, an inexpensive system may be configured.

Figure 19:
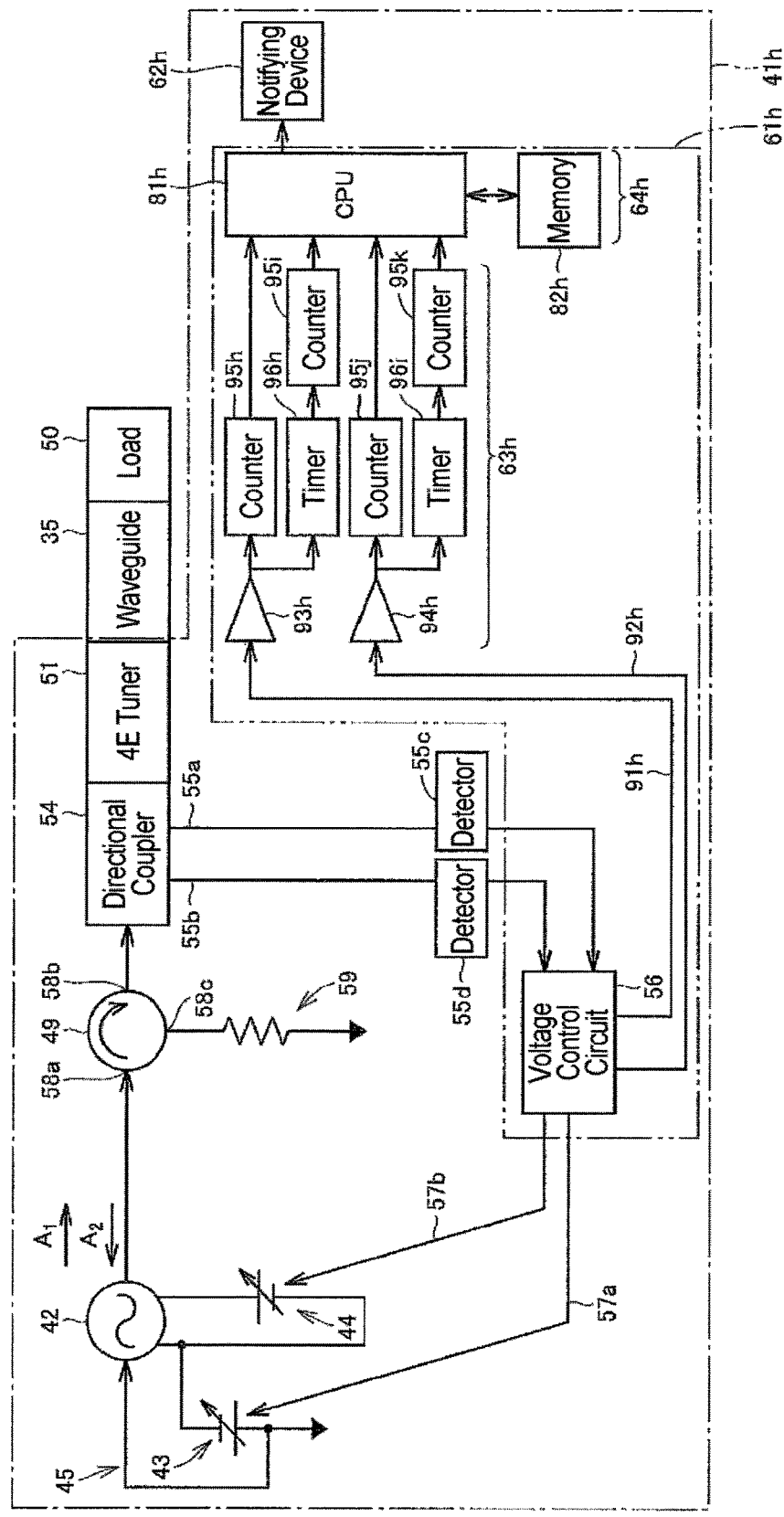
FIG. 19 is a block diagram illustrating a schematic configuration of a microwave generator provided in a plasma processing apparatus according to yet another exemplary embodiment of the present disclosure.

In addition, the following configuration is acceptable. FIG. 19 is a block diagram illustrating a schematic configuration of a microwave generator 41h provided in a plasma processing apparatus according to yet another exemplary embodiment of the present disclosure. FIG. 19 corresponds to the drawings illustrated in, for example, FIGS. 3 and 9. Meanwhile, the configuration other than the determining mechanism included in the microwave generator 41h provided in the plasma processing apparatus according to yet another exemplary embodiment of the present disclosure as illustrated in FIG. 19 is the same as that in the plasma processing apparatus 11, descriptions thereof will be omitted.

Referring to FIG. 19, the microwave generator 41h provided in the plasma processing apparatus according to yet another exemplary embodiment of the present invention includes a fourth determining section 61h serving as a determining mechanism that determines a state of the magnetron 42, and a notifying device 62h serving as a notifying mechanism that performs notification of a determination result made by the fourth determining section 61h. The fourth determining section 61h determines the state of the magnetron 42 based on a fundamental frequency component and a different frequency component oscillated from the magnetron 42.

The fourth determining section 61h includes an accumulated use time detecting unit 63h configured to detect an accumulated use time of the magnetron 42, and an accumulated use time comparing unit 64h configured to compare a value of the accumulated use time of the magnetron 42 detected by the accumulated use time detecting unit 63h and a predetermined value.

The accumulated use time detecting unit 63h includes a gain adjusting amplifier 93h configured to amplify an ON/OFF status signal of a microwave power output though a circuit 91h from the voltage control circuit 56; a gain adjusting amplifier 94h configured to amplify an ON/OFF status signal of a filament power supply output through a circuit 92h from the voltage control circuit 56; a counter 95h configured to count ON/OFF of the microwave power; a timer 96h configured to measure a supply time of the microwave power, i.e. a use time of the microwave power; a counter 95i configured to count an accumulated use time of the microwave power; a counter 95j configured to count ON/OFF of the filament power supply; a timer 96i configured to a supply time of the filament power, i.e., a use time of the filament power 96i; and counter 95k configured to count an accumulated use time of the filament power. In addition, the accumulated use time comparing unit 64h includes a CPU 81h and a memory 82h. In addition, for example, the accumulated use time of the microwave power or the accumulated filament power supply time are considered, and this is compared with a threshold as a determination result and a replacement timing is notified.

With this configuration, the replacement timing of the magnetron 42 may also be scheduled in consideration of the determination result of the state of the magnetron 42. Then, it is possible to avoid the situation that the replacement timing is reached during a plasma processing. Accordingly, with this plasma processing apparatus, the plasma processing may be performed efficiently.

With the above-mentioned configurations, a plasma processing may be performed efficiently.

Meanwhile, although it has been described in the above-described exemplary embodiments that a magnetron is used as a high frequency oscillator, other high frequency oscillators may be used without limiting thereto.

In addition, in the above-described exemplary embodiments, the plasma processing apparatuses may be provided with a plurality of first determining sections, second determining sections, third determining sections, or fourth determining sections. In addition, a determining mechanism may include at least one of: a first determining section configured to determine a state of a high frequency oscillator based on a fundamental frequency component and a different frequency component which are oscillated from the high frequency high frequency oscillator; a second determining section configured to determine the state of the high frequency oscillator based on a frequency of a fundamental wave oscillated from the high frequency oscillator; a third determining section configured to determine the state of the high frequency oscillator based on an efficiency of the high frequency oscillator; and a fourth determining section configured to determine the state of the high frequency oscillator based on a accumulated use time of the high frequency oscillator.

Meanwhile, it has been described in the above-described exemplary embodiments that a band-pass filter is used as a filtering member. In such a case, a low-pass filter (LPF) and a high-pass filter (HPF) may be used in combination, or only one of the LPF and the HPF may be used.

In addition, although it has been described in the above-described exemplary embodiments that a plasma processing is performed by microwaves using a radial line slot antenna, a plasma processing apparatus which includes a comb-type antenna unit to generate plasma by microwaves, or a plasma processing apparatus which radiates microwaves from slots to generate plasma may be used without being limited thereto.

Although exemplary embodiments of the present disclosure have been described above with reference to drawings, the present disclosure is not limited to the exemplary embodiments illustrated in the drawings. Various changes or modifications to the exemplary embodiments illustrated in the drawings may be made within a scope which is the same as or equivalent to the present disclosure.

DESCRIPTION OF SYMBOLS

11: Plasma processing apparatus
12: Processing container
13, 26, 27: Gas supply unit
14: Holding table
15: Control unit
16: Dielectric window
17: Slot antenna plate
18: Dielectric member
19: Plasma generating mechanism
20: Slot hole
21: Bottom portion
22: Side wall
23: Exhaust hole
24: Cover portion
25: O-ring
28: Bottom surface
29: Gas supply system
30a, 30b: Gas supply hole
31: Tubular support
32: Cooling jacket
33: Temperature adjustment mechanism
34: Mode converter
35: Waveguide,
36: Coaxial waveguide
37: Concave portion
38: High frequency power supply
39: Matching unit
40: Circulation path
41a, 41b, 41c, 41d, 41e, 41f, 41g, 41h: Microwave generator
42: Magnetron
43: High voltage power supply
44: Filament power supply
45, 55a, 55b, 91h, 92h: Circuit
46a: Cathode electrode
46b: Anode electrode
48: Microwave
49: Isolator
50: Load
51: 4E tuner
52a, 52b, 52c, 52d: Movable short-circuit unit
53a, 53b, 53c: Probe
53d: Arithmetic operation unit
54: Directional coupler
57a, 57b: Control circuit
55c, 55d, 69a, 69b, 69c, 69e, 70a, 70b, 70c: Detector
56: Voltage control circuit
58a, 58b, 58c: Terminal
59: Dummy load
60: Waveguide
61a, 61b, 61c, 61d, 61e, 61f, 61g, 61h: Determining section
62a, 62b, 62c, 62d, 62e, 62f, 62g, 62h: Notifying device
63a, 63b, 63c: Spectrum level detecting section
63d, 63e, 63f: Frequency detecting unit
63g: Efficiency detecting unit
63h: Accumulated use time detecting unit
64a, 64b, 64c: Spectrum level comparing section
64d, 64e, 64f: Frequency comparing unit
64g: Efficiency comparing unit
64h: Accumulated use time comparing unit
65a, 65b, 65c, 65d, 65e, 65f, 65g, 85d, 85f: Branch portion
66a, 66d, 66e: Attenuator
67a, 67b, 67c, 68a, 68b, 68c: Band-pass filter
71a, 71b, 71c, 71g, 72a, 72b, 72c, 72g, 93h, 94h: Gain adjusting amplifier
73a, 73b: Subtraction circuit
74a, 74b: Comparator
75a, 75b: Threshold adjusting unit
77a, 77b, 78a, 78b: Spectrum
79c, 79d, 79e, 79f, 79g, 80c, 80g, 89g: AD converter
81c, 81d, 81e, 81f, 81g, 81h: CPU, 82c, 82d, 82e, 82f, 82g, 82h: Memory
83a, 83b, 86a, 86b: Line
84d, 84e, 84f: Frequency counter
87g: Anode current measuring unit
88g: Anode voltage measuring unit
95h, 95i, 95j, 95k: Counter
96h, 96i: Timer

The invention claimed is:

1. A plasma processing apparatus which processes an object to be processed using plasma, the plasma processing apparatus comprising:
a processing container within which a plasma processing is performed; and
a plasma generating mechanism including a high frequency generator disposed outside the processing container and configured to generate a high frequency wave including microwave, the plasma generating mechanism being configured to generate plasma within the processing container using the high frequency wave generated by the high frequency generator,
wherein the plasma generating mechanism further includes a dielectric window disposed in an upper portion of the processing container and configured to introduce the high frequency wave generated by the high frequency generator into the processing container, and a circular concave portion recessed in a tapered shape is provided on a portion of a bottom surface of the dielectric window, and
wherein the high frequency generator includes:
a high frequency oscillator configured to oscillate the high frequency wave;
a determining mechanism including a first determining section configured to determine a state of the high frequency oscillator as compared to an initial state of the high frequency oscillator based on a fundamental frequency component and a different frequency component which are included in the high frequency wave oscillated by the high frequency oscillator; and a notifying mechanism configured to perform notification of a determination result made by the determining mechanism such that the high frequency oscillator is replaced at a timing except for a time period during which the plasma processing is performed, wherein the first determining section includes:
(i) a spectrum level detecting section configured to detect a spectrum level of the fundamental frequency component and a spectrum level of the different frequency component, and
(ii) a spectrum level comparing section configured to compare the spectrum level of the fundamental frequency component and the spectrum level of the different frequency component which are detected by the spectrum level detecting section, and wherein the spectrum level of the fundamental frequency component is a decibel value corresponding to a magnitude of the fundamental frequency component, and the spectrum level of the different frequency component is a decibel value corresponding to a magnitude of the different frequency component.

2. The plasma processing apparatus of claim 1, wherein the spectrum level comparing section calculates a difference between the decibel value of the spectrum level of the fundamental frequency component and the decibel value of the spectrum level of the different frequency component which are detected by the spectrum level detecting section, and determines whether the calculated difference is smaller than a predetermined value.

3. The plasma processing apparatus of claim 2, wherein the predetermined value is 40 dBm.

4. The plasma processing apparatus of claim 1, wherein the high frequency generator includes an isolator configured to transmit a frequency signal unidirectionally from the high frequency oscillator to a matcher positioned at a load side, and a waveguide provided between the high frequency oscillator and the isolator and configured to propagate the high frequency wave to the isolator side, and
the spectrum level detecting section detects the spectrum level of the fundamental frequency component and the spectrum level of the different frequency component using a high frequency wave branched from the waveguide.

5. The plasma processing apparatus of claim 1, wherein the high frequency generator includes an isolator configured to transmit a frequency signal unidirectionally from the high frequency oscillator to a matcher positioned at a load side, and a directional coupler configured to extract a part of a high frequency wave matched by the matcher, and
the spectrum level detecting section detects the spectrum level of the fundamental frequency component and the spectrum level of the different frequency component using the high frequency wave extracted from the directional coupler.

6. The plasma processing apparatus of claim 1, wherein the determining mechanism includes a second determining section configured to determine the state of the high frequency oscillator based on an initial frequency of a fundamental wave which is oscillated from the high frequency oscillator.

7. The plasma processing apparatus of claim 6, wherein the second determining section includes a frequency detecting unit configured to detect the initial frequency of the fundamental wave and a current frequency of the fundamental wave, and a frequency comparing unit configured to compare the initial frequency of the fundamental wave and the current frequency of the fundamental wave which are detected by the frequency detecting unit.

8. The plasma processing apparatus of claim 6, wherein the high frequency generator includes an isolator configured to transmit a frequency signal unidirectionally from the high frequency oscillator to a matcher positioned at a load side, and a waveguide provided between the high frequency oscillator and the isolator and configured to propagate the high frequency wave to the isolator side, and
the frequency detecting unit detects the initial frequency of the fundamental wave and the current frequency of the fundamental wave using the high frequency wave branched from the waveguide.

9. The plasma processing apparatus of claim 7, wherein the high frequency generator includes an isolator configured to transmit a frequency signal unidirectionally from the high frequency oscillator to a matcher positioned at a load side, and a directional coupler provided between the isolator and the load and configured to extract a part of a high frequency wave matched by the matcher, and
the frequency detecting unit detects the initial frequency of the fundamental wave and the current frequency of the fundamental wave using the high frequency wave extracted from the directional coupler.

10. The plasma processing apparatus of claim 7, wherein the high frequency generator includes an isolator configured to transmit a frequency signal unidirectionally from the high frequency oscillator to a matcher positioned at a load side, a waveguide provided between the high frequency oscillator and the isolator and configured to propagate the high frequency wave to the isolator side, and a directional coupler provided between the isolator and the load and configured to extract a part of a high frequency wave matched by the matcher, and
the frequency detecting unit detects the initial frequency of the fundamental wave and the current frequency of the fundamental wave using the high frequency wave extracted from the waveguide.

11. The plasma processing apparatus of claim 1, wherein the determining mechanism includes a third determining section configured to determine the state of the high frequency oscillator based on an efficiency of the high frequency oscillator.

12. The plasma processing apparatus of claim 11, wherein the third determining section includes an efficiency detecting unit configured to detect an initial efficiency of the high frequency oscillator and a current efficiency of the high frequency oscillator, and an efficiency comparing unit configured to the initial efficiency of the high frequency oscillator and the current efficiency of the high frequency oscillator which are detected by the efficiency detecting unit.

13. The plasma processing apparatus of claim 12, wherein the high frequency generator includes a circuit configured to apply an anode voltage to the high frequency oscillator, an isolator configured to transmit a frequency signal unidirectionally from the high frequency oscillator to a matcher positioned at a load side, and a directional coupler provided between the isolator and the load and configured to extract a part of a high frequency wave matched by the matcher, and
the efficiency detecting unit detects the initial efficiency of the high frequency oscillator and the current efficiency of the high frequency oscillator, using an input power to the load extracted from the directional coupler, and the anode voltage and the anode current which are detected from the circuit.

14. The plasma processing apparatus of claim 1, wherein the determining mechanism includes a fourth determining section configured to determine the state of the high frequency oscillator based on an accumulated use time of the high frequency oscillator.

15. The plasma processing apparatus of claim 14, wherein the fourth determining section includes an accumulated use time detecting unit configured to detect the accumulated use time of the high frequency oscillator, and an accumulated use time comparing unit configured to compare a value of the accumulated use time of the high frequency use time of the high frequency oscillator detected by the accumulated use time detecting unit and a predetermined value.

16. A high frequency generator comprising:
a high frequency oscillator configured to oscillate a high frequency wave;
a determining unit including a first determining section configured to determine a state of the high frequency oscillator as compared to an initial state of the high frequency oscillator based on a fundamental frequency component and a different frequency component which are included in the high frequency wave oscillated by the high frequency oscillator; and
a notifying unit configured to perform notification of a determination result made by the determining unit such that the high frequency oscillator is replaced at a timing except for a time period in which a plasma processing is performed,
wherein the first determining section includes:
(i) a spectrum level detecting section configured to detect a spectrum level of the fundamental frequency component and a spectrum level of the different frequency component, and
(ii) a spectrum level comparing section configured to compare the spectrum level of the fundamental frequency component and the spectrum level of the different frequency component which are detected by the spectrum level detecting section, and
wherein the spectrum level of the fundamental frequency component is a decibel value corresponding to a magnitude of the fundamental frequency component, and the spectrum level of the different frequency component is a decibel value corresponding to a magnitude of the different frequency component.

17. The high frequency generator of claim 16, wherein the determining unit further includes at least one of: a second determining section configured to determine the state of the high frequency oscillator based on a frequency of a fundamental wave oscillated from the high frequency oscillator;
a third determining section configured to determine the state of the high frequency oscillator based on an efficiency of the high frequency oscillator; and
a fourth determining section configured to determine the state of the high frequency oscillator based on an accumulated use time of the high frequency oscillator.

18. The plasma processing apparatus of claim 7, wherein the frequency comparing unit is further configured to calculate a difference between the initial frequency of the fundamental wave and the current frequency of the fundamental wave which are detected by the frequency detecting unit, and
the determining mechanism is configured to determine a replacement timing of the high frequency oscillator when the difference between the initial frequency of the fundamental wave and the current frequency of the fundamental wave is larger than ±7 MHz.

* * * * *